(12) United States Patent
Hempel et al.

(10) Patent No.: US 8,664,103 B2
(45) Date of Patent: Mar. 4, 2014

(54) METAL GATE STACK FORMATION FOR REPLACEMENT GATE TECHNOLOGY

(75) Inventors: Klaus Hempel, Dresden (DE); Andy Wei, Dresden (DE); Robert Binder, Dresden (DE); Joachim Metzger, Butzbach (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 341 days.

(21) Appl. No.: 13/154,578

(22) Filed: Jun. 7, 2011

(65) Prior Publication Data

US 2012/0315749 A1 Dec. 13, 2012

(51) Int. Cl.
*H01L 21/3205* (2006.01)

(52) U.S. Cl.
USPC ........... 438/595; 438/216; 438/585; 438/592; 438/270; 438/591; 257/369; 257/E21.159; 257/E21.409

(58) Field of Classification Search
USPC .................. 438/199, 216, 585, 591, 592, 270
See application file for complete search history.

(56) References Cited

U.S. PATENT DOCUMENTS

| | | |
|---|---|---|
| 2002/0149065 A1 | 10/2002 | Koyama et al. |
| 2007/0249106 A1 | 10/2007 | Koyama et al. |
| 2011/0193162 A1* | 8/2011 | Chuang et al. ................ 257/343 |
| 2012/0228715 A1* | 9/2012 | Niimi et al. .................... 257/369 |
| 2012/0241709 A1* | 9/2012 | Tsuji ................................ 257/2 |

OTHER PUBLICATIONS

Chambers et al., "Metal Gate Electrode Impurity Engineering for Control of Effective Work Function," Feb. 23, 2010.
Translation of Official Communication from German Patent Application No. 10 2012 209 512.8 dated Jan. 30, 2013.

* cited by examiner

*Primary Examiner* — Mamadou Diallo
(74) *Attorney, Agent, or Firm* — Amerson Law Firm, PLLC

(57) ABSTRACT

Generally, the subject matter disclosed herein relates to modern sophisticated semiconductor devices and methods for forming the same, wherein a reduced threshold voltage ($V_t$) may be achieved in HK/MG transistor elements that are manufactured based on replacement gate electrode integrations. One illustrative method disclosed herein includes forming a first metal gate electrode material layer above a gate dielectric material layer having a dielectric constant of approximately 10 or greater. The method further includes exposing the first metal gate electrode material layer to an oxygen diffusion process, forming a second metal gate electrode material layer above the first metal gate electrode material layer, and adjusting an oxygen concentration gradient and a nitrogen concentration gradient in at least the first metal gate electrode material layer and the gate dielectric material layer.

27 Claims, 12 Drawing Sheets

METAL GATE STACK FORMATION FOR REPLACEMENT GATE TECHNOLOGY

BACKGROUND

1. Field of the Disclosure

Generally, the present disclosure relates to sophisticated integrated circuits, and, more particularly, to forming metal gate stacks based on replacement gate processing technology for transistor elements having lower threshold voltages.

2. Description of the Related Art

The fabrication of advanced integrated circuits, such as CPU's, storage devices, ASIC's (application specific integrated circuits) and the like, requires the formation of a large number of circuit elements on a given chip area according to a specified circuit layout, wherein field effect transistors represent one important type of circuit elements that substantially determine performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

For many device technology generations, the gate electrode structures of most transistor elements has comprised silicon-based materials, such as a silicon dioxide and/or silicon oxynitride gate dielectric layer, in combination with a polysilicon gate electrode. However, as the channel length of aggressively scaled transistor elements has become increasingly smaller, many newer generation devices have turned to gate electrode stacks comprising alternative materials in an effort to avoid the short-channel effects which may be associated with the use of traditional silicon-based materials in reduced channel length transistors. For example, in some aggressively scaled transistor elements, which may have channel lengths of 14-32 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

Depending on the specific overall device requirements, several different high-k materials—i.e., materials having a dielectric constant, or k-value, of approximately 10 or greater—have been used with varying degrees of success for the gate dielectric layer of an HK/MG gate electrode structure. For example, in some transistor element designs, a high-k gate dielectric layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$), and the like. Furthermore, one or more of a plurality of different non-polysilicon metal gate electrode materials—i.e., a metal gate stack—may be used in HK/MG configurations so as to control the work function of the transistor, as will be discussed in more detail below. These metal gate electrode materials may include, for example, titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), and the like.

One processing method that has been used for forming high-k/metal gate transistor elements is the so-called "gate last" or "replacement gate" technique. FIGS. 1a-1c depict one illustrative prior art method for forming an HK/MG gate electrode structure based on the replacement metal gate (RMG) technique. More specifically, FIGS. 1a-1c schematically illustrate an "HK-last" RMG technique, wherein the "HK" (i.e., high-k) dielectric layer is formed after the dummy gate electrode has been removed, as will now be described in further detail.

FIG. 1a schematically shows a cross-sectional view of an illustrative semiconductor device 100 comprising an illustrative MOS transistor element 150 in an intermediate manufacturing stage using a replacement gate processing technique, wherein initial device processing steps have been performed based on a dummy gate electrode 109. The semiconductor device 100 of FIG. 1a may comprise a substrate 101, in and above which the illustrative transistor element 150 may be formed based on well-established semiconductor device processing techniques. For example, the transistor element 150 may include a gate electrode structure 110, and the substrate 101 may represent any appropriate substrate on which may be formed a semiconductor layer 103, such as a silicon-based layer, or any other appropriate semiconductor material that may facilitate the formation of the MOS transistor element 150. It should be appreciated that the semiconductor layer 103, even if provided as a silicon-based layer, may include other materials, such as germanium, carbon and the like, in addition to an appropriate dopant species for establishing the requisite conductivity type in an active region 102 of the semiconductor layer 103. Furthermore, in some illustrative embodiments, the transistor element 150 may be formed as one of a plurality of bulk transistors, i.e., the semiconductor layer 103 may be formed on or be part of a substantially crystalline substrate material, while in other cases specific device regions of the device 100 or the entire device 100 may be formed on the basis of a silicon-on-insulator (SOI) architecture, in which a buried insulating layer (not shown) may be provided below the semiconductor layer 103.

As shown in FIG. 1a, the active region 102 is typically enclosed by an isolation structure 104, which in the present example may be provided in the form of a shallow trench isolation that is typically used for sophisticated integrated circuits. In the illustrated embodiment, highly doped source and drain regions 106, including extension regions 105 that usually comprise a dopant concentration less than the highly doped regions 106, are formed in the active region 102. The source and drain regions 106, including the extension regions 105, are laterally separated by a channel region 107. Furthermore, the source and drain regions 106 may also comprise metal silicide contact regions 111, which may facilitate the formation of electrical contacts to the transistor element 150. The gate electrode structure 110 is formed above the channel region 107, and may be made up of the dummy gate electrode 109 which, in the manufacturing stage shown in FIG. 1a, may be separated from the underlying channel region 107 by an ultrathin interfacial layer 108. In a typical replacement metal gate integration scheme, the dummy gate electrode 109 may comprise, for example, polysilicon material, and the ultrathin interfacial layer 108 may comprise silicon dioxide, which may be formed to a thickness of approximately 6-10 Å by performing an oxidation process, such as a wet chemical oxidation process, recipes for which are known in the art.

Additionally, depending on the overall process flow requirements, the gate electrode structure 110 may also comprise sidewall spacer structures 110s on or adjacent to the sidewalls of the dummy gate electrode 109, which, depending on the device requirements and/or the process strategy, may include one, two, or even more spacer elements, such as offset spacers, conformal liners, and the like, which may act as appropriate implantation masks for creating the lateral dopant profile for the highly doped drain and source regions 106 and extension regions 105. The sidewall spacer structures 110s may comprise one or more suitable dielectric materials, such as silicon dioxide, silicon nitride, silicon oxynitride, and the like. Furthermore, it should be noted that, in those instances wherein the sidewall spacer structures 110s comprise multiple spacer elements, the materials comprising adjacent spacer elements may be different so as to provide the requisite etch selectivity that may be necessary to obtain the desired dopant profile.

As illustrated in FIG. 1a, the semiconductor device 100 may also comprise an interlayer dielectric (ILD) material layer 112, which may act to electrically isolate the transistor element 150 from any subsequently formed metallization layers (not shown). The interlayer dielectric material layer 112 may comprise one or more of several well-known conventional silicon-based dielectric materials, such silicon dioxide, silicon nitride, silicon oxynitride, and the like. Depending on the device design and overall process flow requirements, the interlayer dielectric material layer 111 may also comprise suitably selected low-k dielectric materials, such as porous silicon dioxide, organic polyimides, or organosilicates such as methyl silsesquioxane (MSQ) and the like, wherein it should be understood that a low-k dielectric material may be considered as a material having a k-value that is approximately 3 or less.

After completion of initial device processing steps, such as, for example, patterning of the dummy gate electrode 109; formation of the sidewall spacer structures 110s; formation of source/drain and extension regions 106, 105; formation of silicide regions 111, and the like, the semiconductor device 100 depicted in FIG. 1a may be exposed to a selective etch process 131 adapted to remove the dummy gate electrode 109 in preparation for forming a replacement metal gate electrode. The etching process 131 results in the removal of the dummy gate electrode 109 and the formation of an opening 113 (see FIG. 1b) in the gate electrode structure 110. In certain embodiments, the etching process 131 may be designed to selectively remove the material of the dummy gate electrode 109 relative to the material compositions of the sidewall spacer structures 110s, the interlayer dielectric material layer 111, and the interfacial layer 108. For example, a dummy gate electrode 109 comprising polysilicon material may be selectively removed using any one of several suitably designed wet etch chemistries well known in the art—such as wet inorganic ammonia, tetramethylammonium hydroxide (TMAH), and the like—without inducing undue damage to the surrounding materials, including the nitride and/or oxide materials comprising the interlayer dielectric material layer 111, the sidewall spacer structures 110s, and the interfacial layer 108. Additionally, well known dry etch recipes, such as fluorine or halogen-based RIE and the like, may also be used, as well as etch sequences that utilize a combination of both wet and dry etch processes.

It should be noted that, depending on the specific etch recipe used, the ultrathin interfacial layer 108 may be partially, or even completely, removed during performance of the etching process 131. In such circumstances, the interfacial layer 108 may be grown and/or re-grown by performing an additional oxidation process similar to that used to initially form the interfacial layer 108, such as a wet chemical oxidation process and the like, thereby ensuring that the interfacial layer 108 has an appropriate thickness, such as in the range of approximately 6-10 Å, prior to proceeding with subsequent processing steps, as discussed below.

FIG. 1b depicts the prior art semiconductor device 100 of FIG. 1a in a further manufacturing stage, after the dummy gate electrode 109 has been removed by the etch process 131. As shown in FIG. 1b, and as an initial step in forming a replacement metal gate electrode, a layer of high-k dielectric material 114, such as hafnium oxide (HfO) and the like, may be formed above the semiconductor device 100—including inside of the opening 113—which thereby serves as a gate dielectric layer of the MOS transistor element 150. The layer of high-k dielectric material 114 may be formed by performing a highly conformal deposition process 132, such as an atomic layer deposition (ALD), a chemical vapor deposition (CVD) process such as metal organic chemical vapor deposition (MOCVD) and the like, thereby forming the layer of high-k dielectric material layer 114 to a thickness ranging from approximately 15-20 Å.

FIG. 1c schematically illustrates the prior art semiconductor device 100 of FIG. 1b in an advanced manufacturing stage, after one or more layers of metal gate electrode material have been formed above the semiconductor device 100 and inside of the opening 113, thereby forming the replacement metal gate electrode 110g. In a typical replacement metal gate (RMG) process flow, a first layer of metal gate material 115 may be formed in the opening 113, the material of which may be selected so as to facilitate the proper control of the device work function, both for P-type and N-type MOS (i.e., PMOS and NMOS) transistor elements. Furthermore, depending on the device type (PMOS or NMOS), work function, and threshold voltage requirements, the first layer of metal gate material 115 may comprise a plurality of sub-layers, each of which may comprise different metal gate material, as listed previously. In the illustrative semiconductor device 100 depicted in FIG. 1c, the first layer of metal gate material 115 may comprise, for example, three sub-layers 115a, 115b and 115c, comprising, for example, TiN, TaN, and TiN, respectively. More or fewer sub-layers, comprising other metal gate materials as listed above, may also be used to obtain the desired operational characteristics of the transistor element 150. Additionally, a second layer of metal gate material 116, such as TiAl and the like, may be formed above the first layer of metal gate material 115 so as to completely fill the opening 113. Thereafter, further device processing may continue so as to remove excess material of the high-k dielectric material layer 114 and the first and second layers of metal gate material 115, 116 formed above the ILD layer 112 and outside of the opening 113 so as to form the replacement metal gate electrode 110g.

It should be noted that the above described process flow may sometimes result in the threshold voltage ($V_t$) of the MOS transistor element 150 being higher than desired—in particular, when the MOS transistor element 150 is a PMOS transistor element. Theoretical models indicate that a low threshold voltage ($V_t$) in HK/MG PMOS transistor elements may be achieved when the oxygen content in the first layer of metal gate material 115, more specifically, in the lower portion of the first TiN sub-layer 115a, close to the interface 110i with the high-k dielectric material layer 114, is relatively high, and when the nitrogen content of the sub-layer 115a peaks near the interface 110i. Prior art processes to address the oxygen content issue incorporate oxygen into the TiN sub-layer 115a by performing a relatively high-temperature thermal oxidation process above 400° C., such as in the range of 450° C. to 1000° C. However, exposing device to a thermal oxidation process above 400° C. can result in a growth and/or re-growth of the interfacial oxide layer 108, thereby increasing the thickness of the interfacial oxide layer 108 by a factor of 2 or more—i.e., up to a thickness of 20 Å or even greater. Furthermore, depending on the temperature at which the thermal oxidation process is performed, the TiN sub-layer 115a may be transformed into titanium oxide (TiO). These two detrimental factors—i.e., the increased thickness of the interfacial oxide layer 108 and the transformation of the TiN sub-layer to TiO—may further contribute to an increased threshold voltage ($V_t$) of the PMOS transistor element, as well as reduced overall device reliability.

Accordingly, there is a need to implement new design strategies to address the manufacturing and performance issues associated with the typical replacement metal gate process flows, such as that described with respect to FIGS. 1a-1c. The present disclosure relates to process schemes that are directed to avoiding, or at least reducing, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to modern sophisticated semiconductor devices and methods for forming the same, wherein a reduced threshold voltage ($V_t$) may be achieved in HK/MG transistor elements that are manufactured based on replacement gate electrode integrations. One illustrative method disclosed herein includes forming a first metal gate electrode material layer above a gate dielectric material layer having a dielectric constant of approximately 10 or greater. The method further includes exposing the first metal gate electrode material layer to an oxygen diffusion process, forming a second metal gate electrode material layer above the first metal gate electrode material layer, and adjusting an oxygen concentration gradient and a nitrogen concentration gradient in at least the first metal gate electrode material layer and the gate dielectric material layer.

Also disclosed herein is a method that includes forming a gate dielectric layer of a PMOS transistor element above an interfacial layer formed above an active region of a semiconductor device, the gate dielectric layer comprising a high-k dielectric material having a dielectric constant of approximately 10 or greater. Furthermore, the method includes forming a first layer of metal gate electrode material on the gate dielectric layer and exposing the first layer of metal gate electrode material to an oxygen diffusion process at a temperature less than approximately 200° C. Finally, the disclosed method also includes, among other things, forming a second layer of metal gate electrode material on the first layer of metal gate electrode material, and exposing the semiconductor device to a thermal treatment in an oxygen-free ambient at a temperature less than approximately 400° C.

BRIEF DESCRIPTION OF THE DRAWINGS

The disclosure may be understood by reference to the following description taken in conjunction with the accompanying drawings, in which like reference numerals identify like elements, and in which.

Figure 1A:
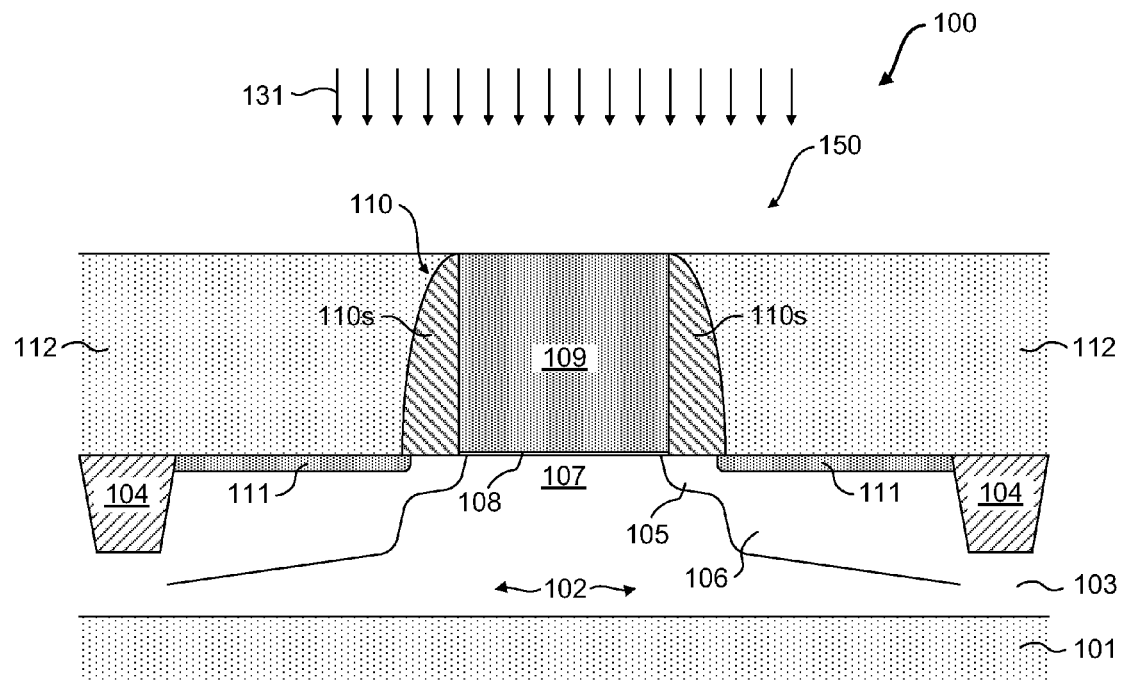
FIGS. 1a-1c schematically illustrate a process flow of an illustrative prior art method for forming an "HK-last" replacement metal gate electrode of a semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the presently disclosed subject matter provides manufacturing techniques for forming high-k dielectric/metal gate electrode (HK/MG) MOS transistor elements having a reduced threshold voltage ($V_t$) based on replacement gate integrations. For example, in certain illustrative embodiments, the methods disclosed herein utilize techniques for increasing the oxygen content of the metal gate electrode material in the layer portion nearest to the interface with the high-k dielectric material layer, as well as for providing a peak value of the nitrogen content near the HK/MG interface. Furthermore, the techniques described below may diminish, and in some instances substantially avoid, the problems associated with the typical thermal oxidation processes used to reduce the threshold voltage ($V_t$) of MOS transistor elements, such as the potential for increased growth and/or re-growth of the interfacial oxide layer between the high-k dielectric material layer and the semiconductor material in the channel region below the HK/MG gate electrode structure, as well as the potential for transformation of TiN metal gate electrode materials into TiO, both of which may contribute to higher threshold voltages ($V_t$) as well as reduced device reliability.

The present disclosure is also directed to two different aspects of replacement gate integration schemes, specifically "HK-last" and "HK-first" techniques. In the so-called "HK-last" replacement gate approach, a layer of gate electrode material, such as polysilicon, may be formed above the active area of a semiconductor device and patterned to form a dummy gate electrode—i.e., a gate electrode that will eventually be removed and replaced with a metal gate electrode. Thereafter, source/drain extension regions may be doped with appropriate dopant species, spacer elements for defining deep source/drain regions may be formed, the deep source/drain regions may be implanted with dopants, activation annealing steps performed, silicide contact regions may be formed in the source/drain regions, and an interlayer dielectric (ILD) material layer may be formed above the device—all while the dummy gate electrode remains in place above the active area. After these and/or other processing steps have been performed, the dummy gate electrode may be selectively removed to expose the interfacial oxide layer and/or channel region of the device, and the "HK" (i.e., high-k) gate dielectric material layer is formed above the channel region. Subsequently, the metal gate electrode material stack may be formed above the high-k gate dielectric layer so as to adjust the work function of the MOS transistor element as may be required for the specific device type and operating characteristics.

On the other hand, the so-called "HK-first" technique is a hybrid replacement gate approach wherein a layer of high-k dielectric material and a first very thin layer (i.e., less than approximately 3 nm) metal layer, such as titanium nitride and the like, may be formed above the active area of a semiconductor device, followed by a layer of gate electrode material, such as polysilicon. Next, this material stack—including the high-k dielectric layer and the dummy gate electrode material layer—may be patterned to form the dummy gate electrode, and the subsequent processing steps such source/drain and extension regions formation, sidewall spacer formation, silicide contact formation, ILD formation, and the like, may be performed as noted above. Thereafter, the gate electrode material portion of the dummy gate electrode may be selectively removed to expose the first thin metal layer, after which the metal gate electrode material stack for adjusting the device work function may be formed above the high-k dielectric material.

After a complete reading of the present application, those skilled in the art will recognize that the illustrative techniques disclosed herein may be employed in manufacturing a variety of device, such as PMOS or NMOS transistor devices. Moreover, while the present figures and discussion associated with each are generally directed to single transistor elements, the presently disclosed methods may also be applied to devices based on CMOS architecture, i.e., when both PMOS and NMOS devices are formed based on at least some of the same process integration steps.

Figure 1B:
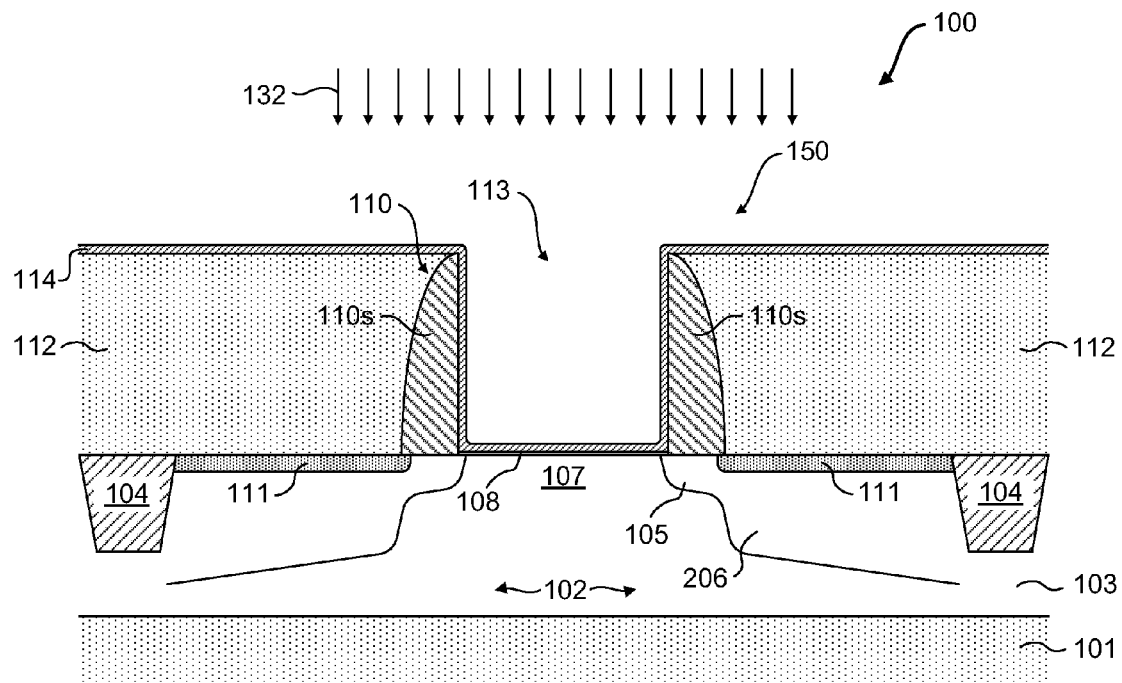
Figure 1C:
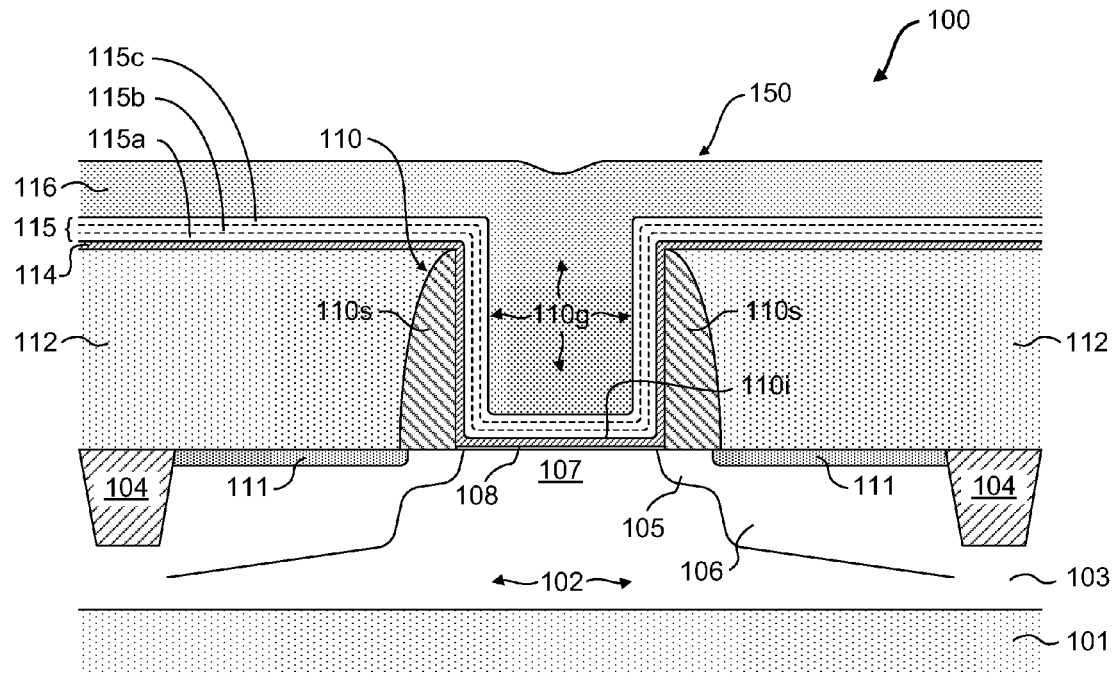

It should be noted that, where appropriate, the reference numbers used in describing the various elements shown in the illustrative embodiments of FIGS. 2*a*-2*m* and FIGS. 3*a*-3*d* substantially correspond to the reference numbers used in describing the corresponding elements illustrated in FIGS. 1*a*-1*c* above, except that the leading numeral for has been changed from a "1" to a "2" or to a "3," as may be appropriate. For example, transistor element "100" corresponds to transistor elements "200" and/or "300," interfacial layer "108" corresponds to interfacial layers "208" and/or "308," the high-k dielectric material layer "114" corresponds to the high-k dielectric material layers "214" and/or "314," and so on. Accordingly, the reference number designations used to identify some elements of the presently disclosed subject matter may be illustrated in the FIGS. 2*a*-2*g* and FIGS. 3*a*-3*b*, but may not be specifically described in the following disclosure. In those instances, it should be understood that the numbered elements shown in FIGS. 2*a*-2*g* and FIGS. 3*a*-3*b* which are not described in detail below substantially correspond with their like-numbered counterparts illustrated in FIGS. 1*a*-1*e*, and described in the associated disclosure set forth above.

Furthermore, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor device 100 depicted in FIG. 1a, it should be understood that the gate electrode structure 110 is formed "above" the active region 102, and the substrate 101 is positioned "below" or "under" the semiconductor layer 103. Similarly, it should also be noted that sidewall spacer structures 110s are positioned "adjacent to" the sidewalls of the dummy gate electrode 109, whereas in special cases, the spacer structures 110s may be positioned "on" the sidewalls of the dummy gate electrode 109 in those embodiments wherein no other layers or structures are interposed therebetween.

Figure 2A:
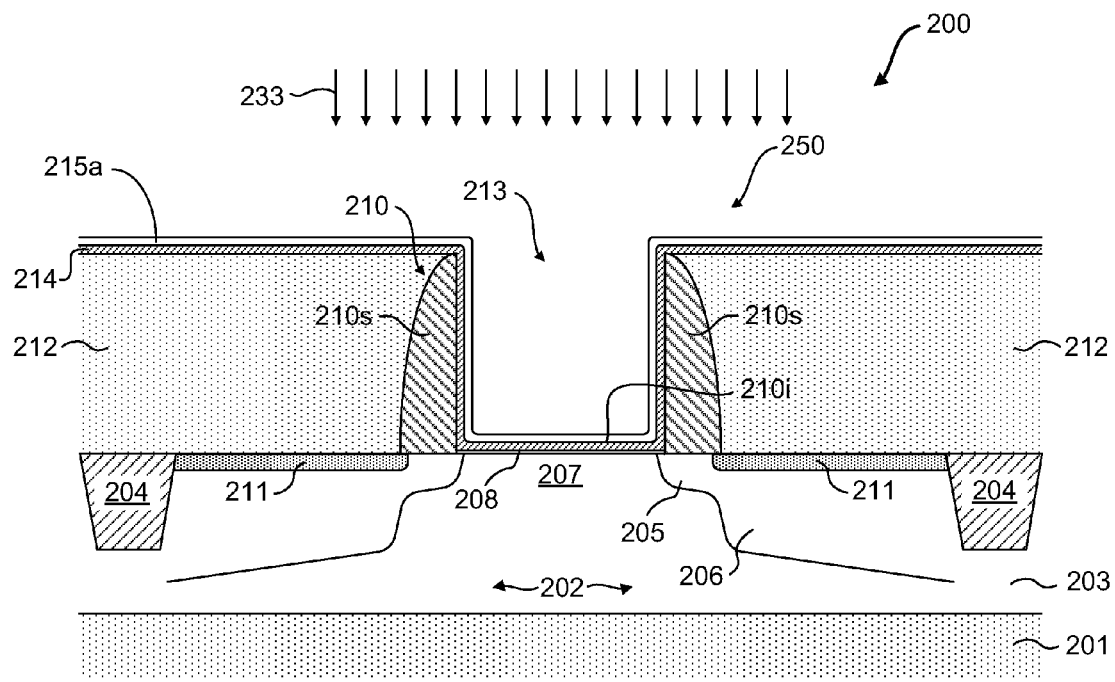
FIGS. 2a-2f schematically illustrate embodiments of an illustrative process flow of forming an "HK-last" replacement metal gate electrode in accordance with the subject matter disclosed herein.
Figure 2B:
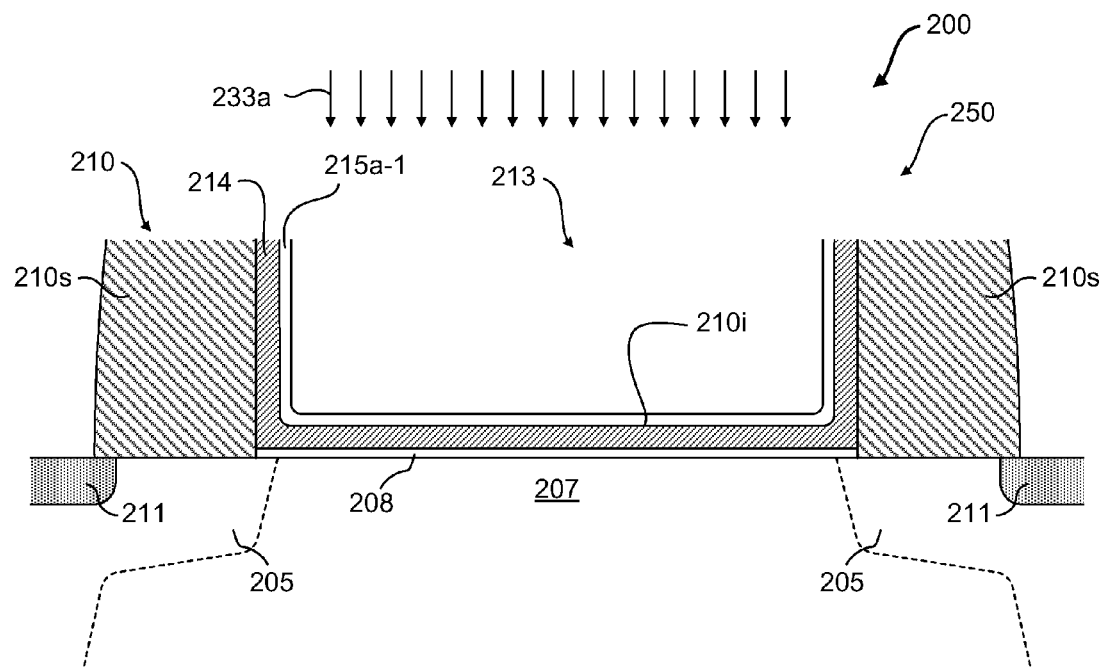
Figure 2C:
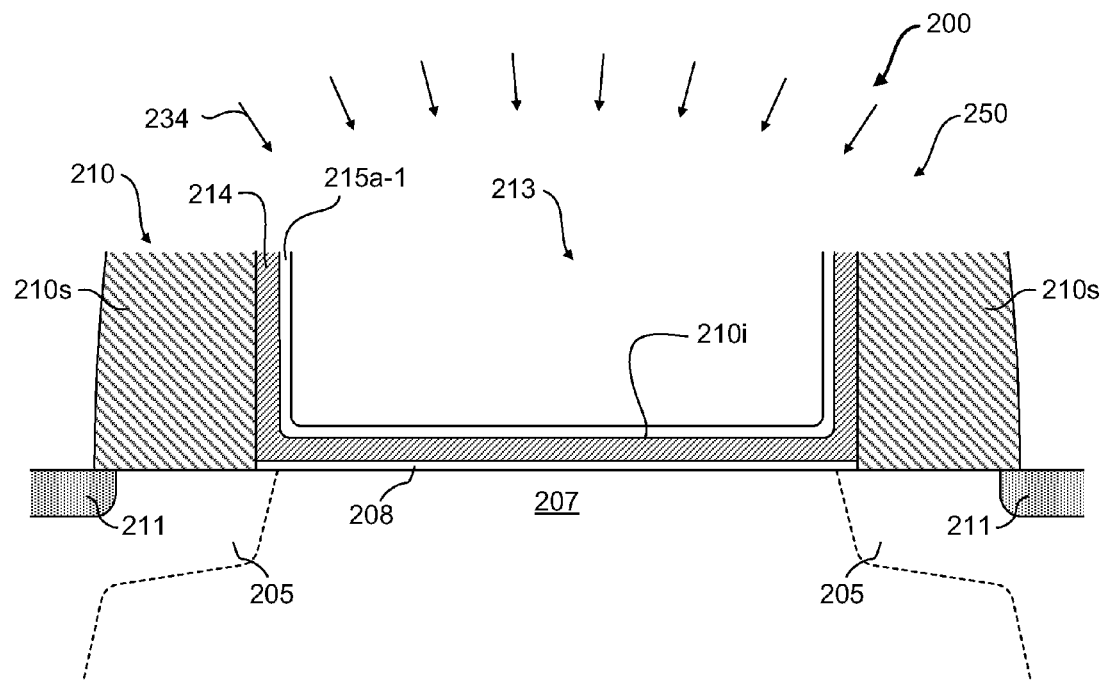
Figure 2D:
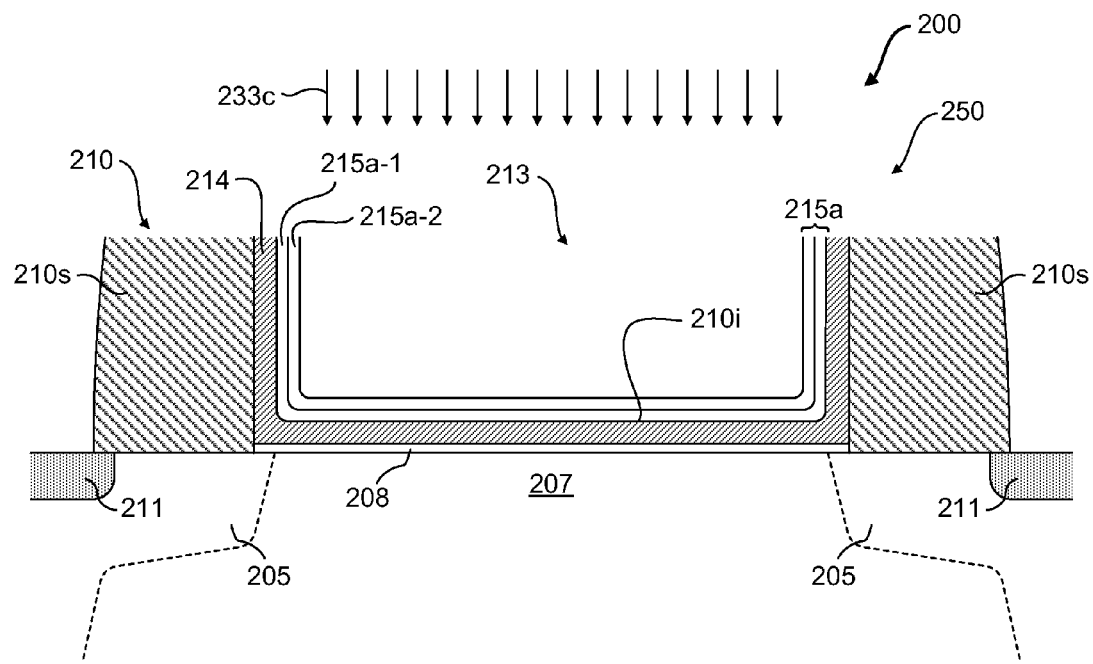
Figure 2E:
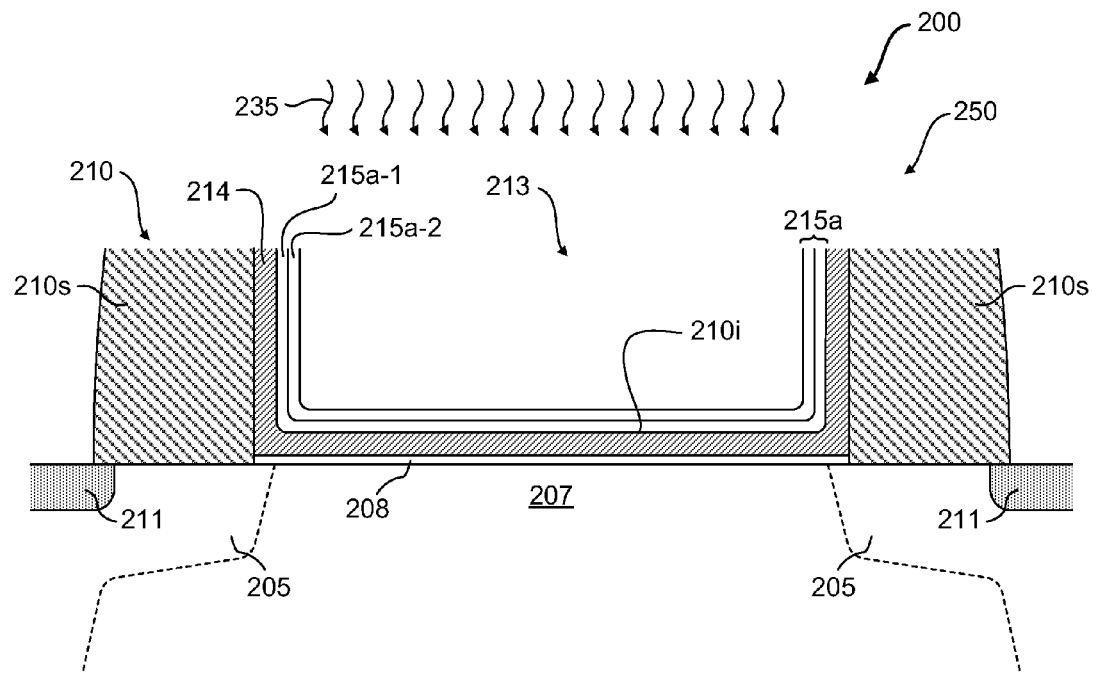
Figure 2F:
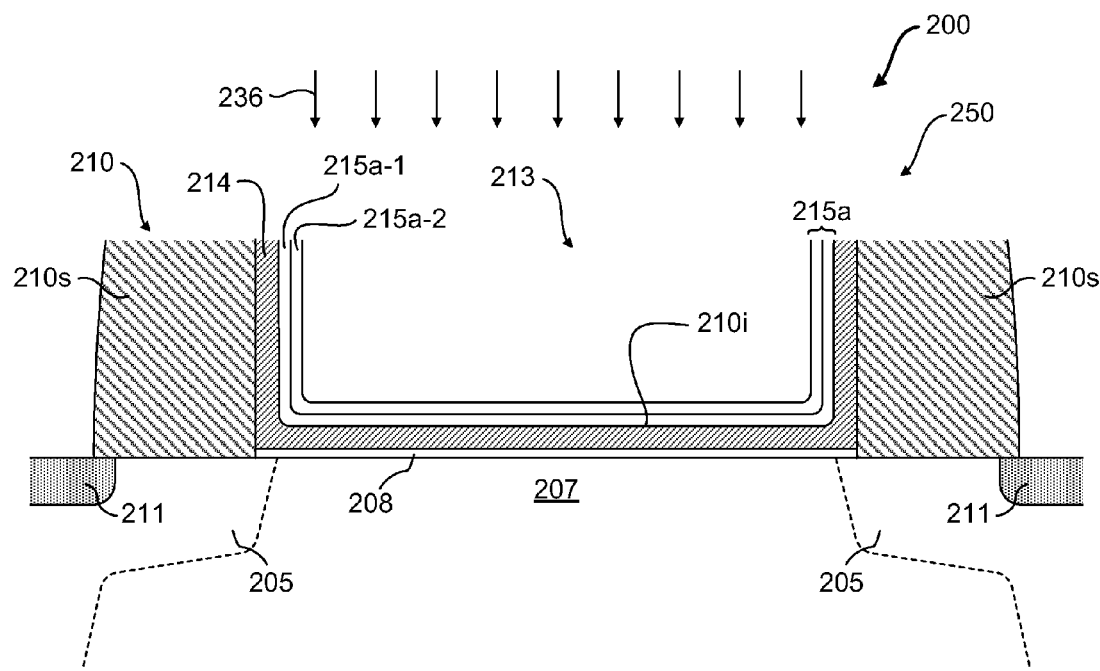
Figure 2G:
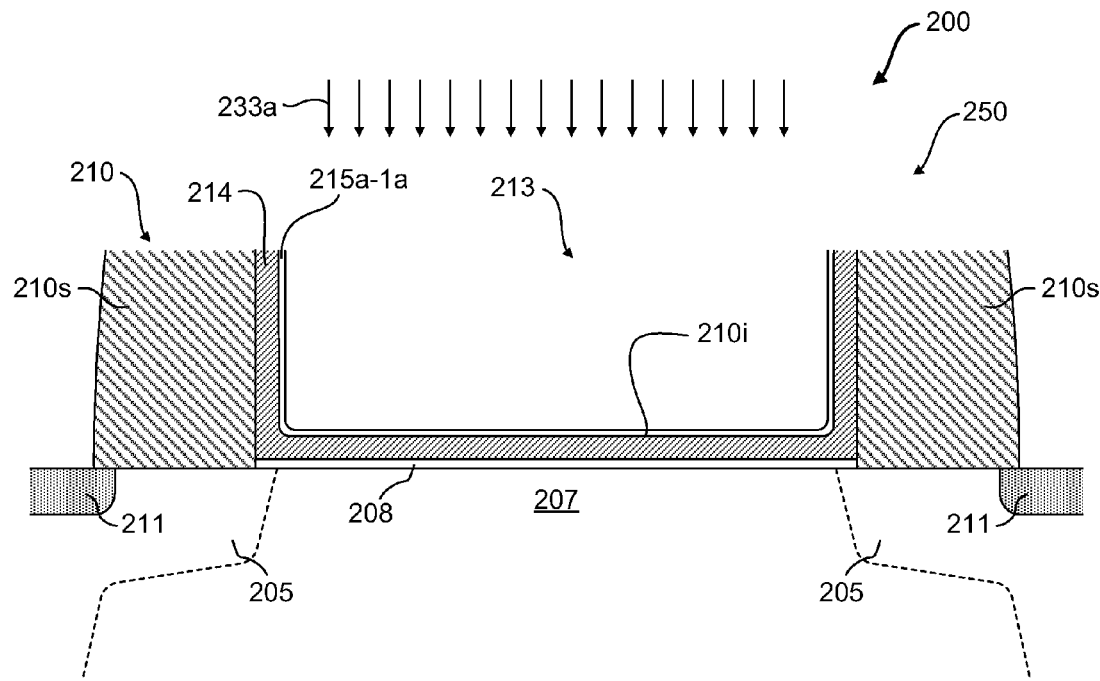
FIGS. 2g-2l schematically illustrate other embodiments of an illustrative process flow of forming an "HK-last" replacement metal gate electrode in accordance with the subject matter disclosed herein.
Figure 2H:
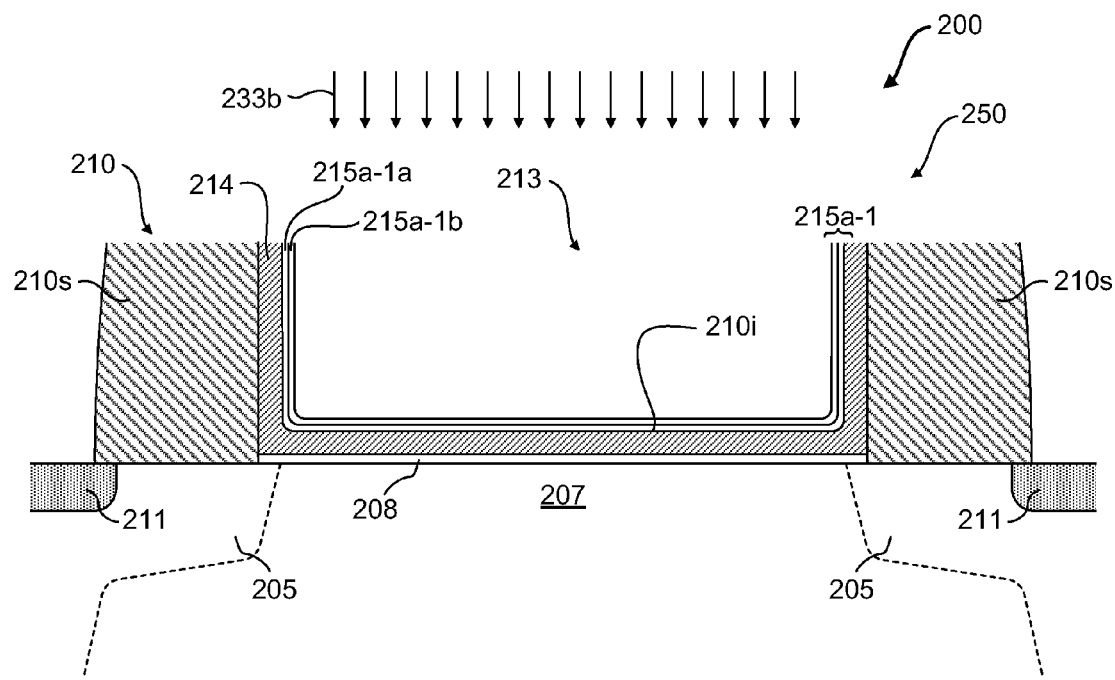
Figure 2I:
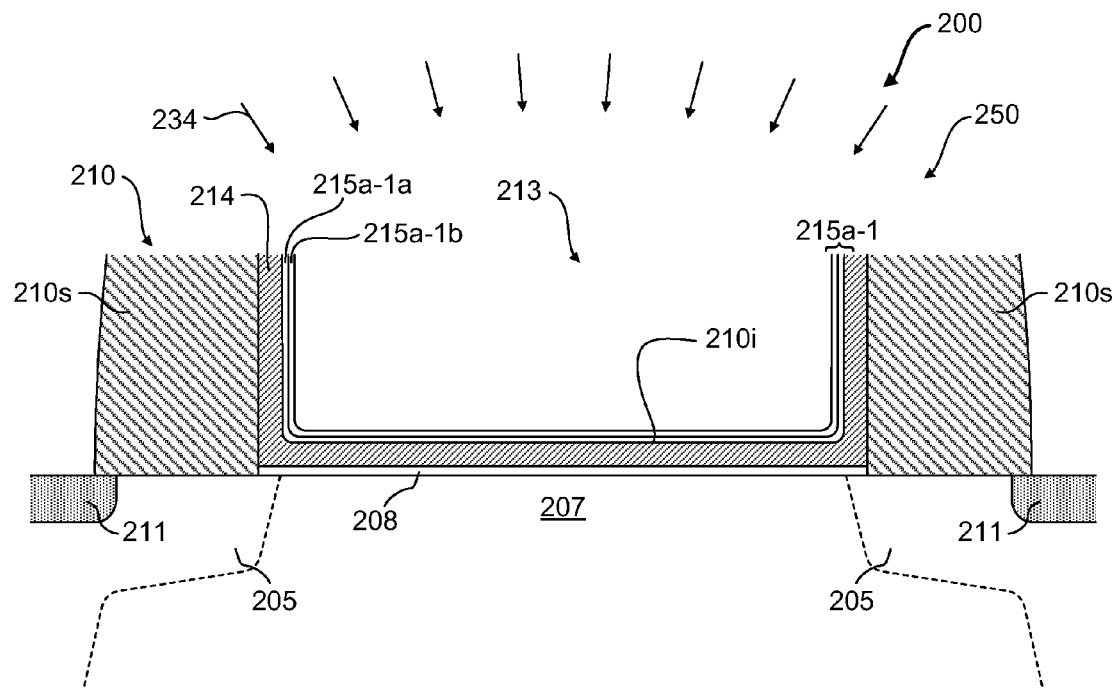
Figure 2J:
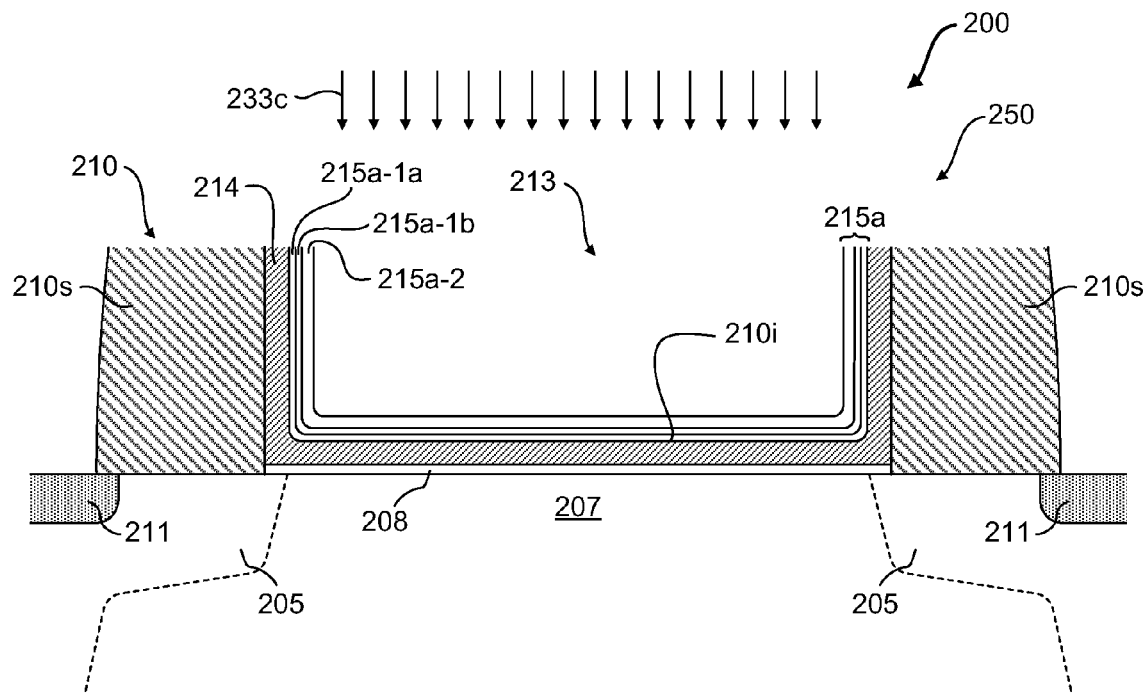
Figure 2K:
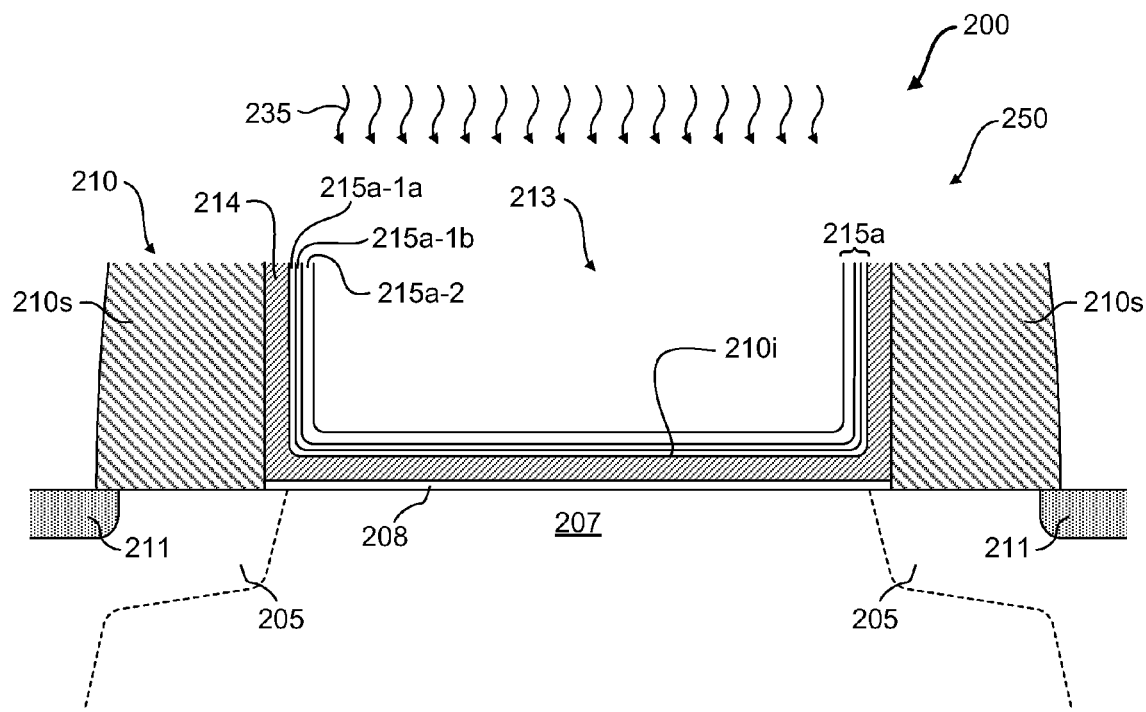
Figure 2L:
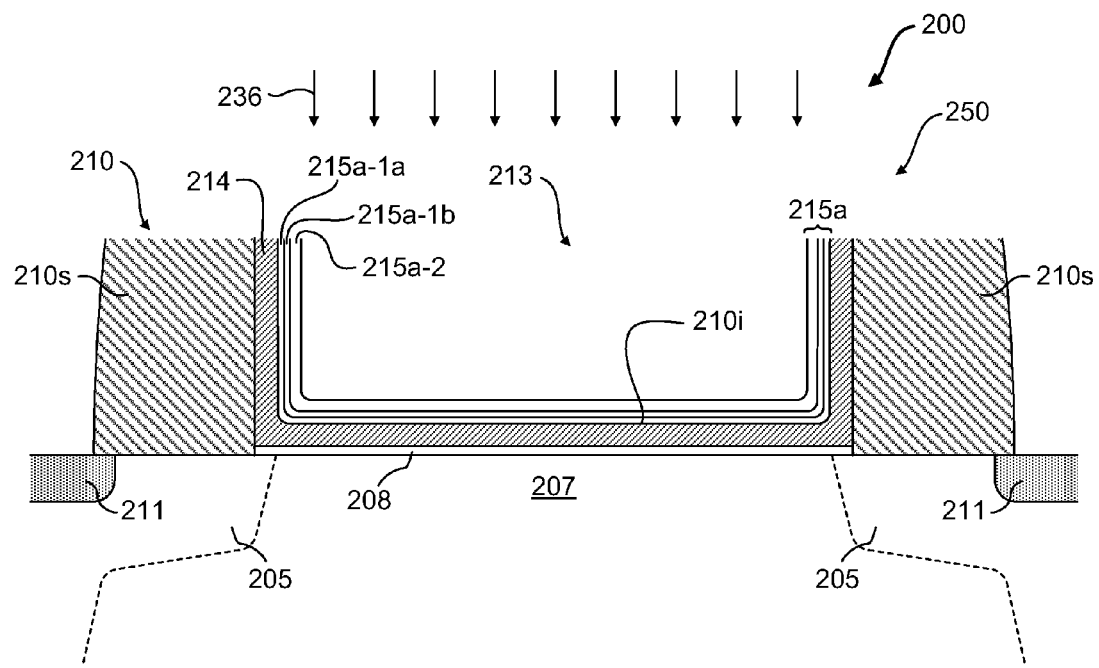
Figure 2M:
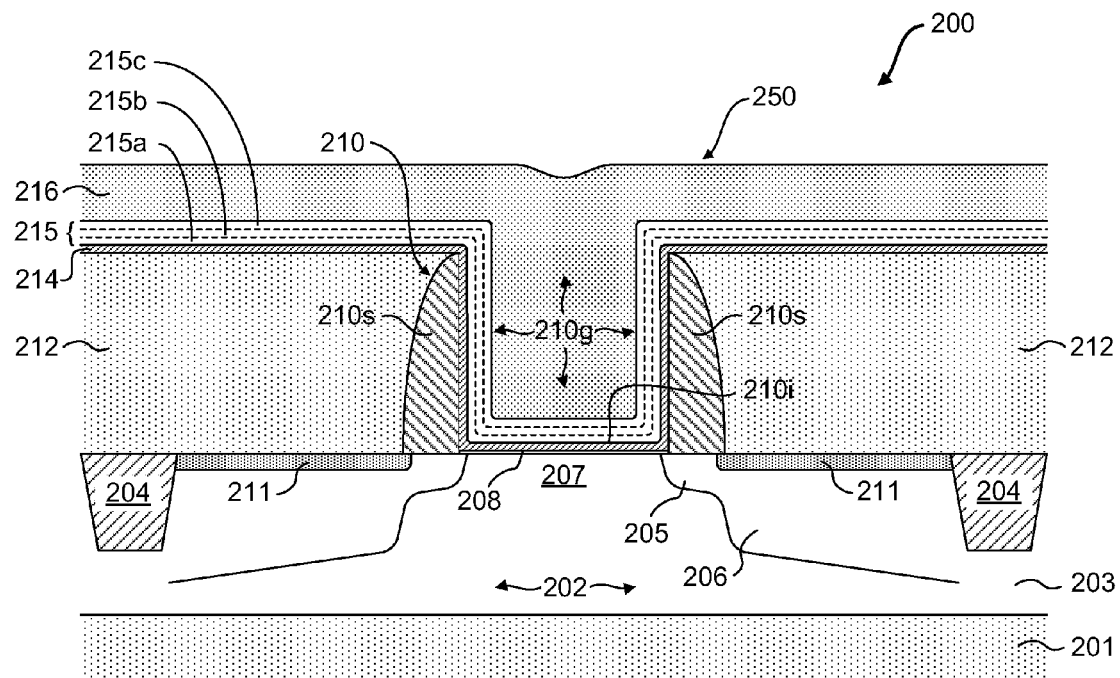
FIG. 2m schematically illustrates the illustrative "HK-last" replacement metal gate electrodes of FIGS. 2a-2f and FIGS. 2g-2l in accordance with a further advanced manufacturing stage of the subject matter disclosed herein.

FIG. 2a shows a schematic cross-sectional view of an illustrative semiconductor device 200 of the present disclosure that substantially corresponds to the semiconductor device 100 illustrated in FIG. 1b, after a layer of high-k dielectric material 214 has been formed above the semiconductor device 200 and inside of the opening 213, and which, in an "HK-last" replacement gate technique, may act as a gate dielectric layer of a replacement metal gate electrode 210g (see FIG. 2m). Depending on the device type and desire operating characteristics, the layer of high-k dielectric material 214 may comprise any one of several high-k materials known in the art and previously described, and in some illustrative embodiments may comprise, for example, hafnium oxide (HfO) and the like. Processing steps for forming the semiconductor device 200 depicted in FIG. 2a may be substantially as described above with respect to the semiconductor device 100 of FIG. 1b. Furthermore, as shown in FIG. 2a, a first sub-layer 215a of a first layer of metal gate material 215 (see FIG. 2m) may also be formed on or above the layer of high-k dielectric material 214. In some illustrative embodiments, the first sub-layer 215a may comprise a suitable metal gate electrode material as previously described, such as titanium nitride (TiN) and/or titanium (Ti) and the like, and may have thickness ranging on order of 15-20 Å. The first sub-layer 215a may be formed by performing a deposition sequence 233 that is adapted to control the oxygen and nitrogen content distribution in the first sub-layer 215a near the interface 210i with the layer of high-k dielectric material 214, which, as previously described, may facilitate achieving a lower threshold voltage ($V_t$) of the transistor element 250, thereby increasing device performance. Moreover, depending on the desired device operating characteristics and threshold voltage ($V_t$), the deposition sequence 233 may, in certain illustrative embodiments, comprise a plurality of steps, and the first sub-layer 215a may comprise two or more material layers. Various illustrative embodiments of performing the deposition sequence 233 so as to control oxygen and nitrogen concentrations in the sub-layer 215a are illustrated in FIGS. 2b-2f and FIGS. 2g-2l, which will now be described in detail below.

FIGS. 2b-2f schematically depict an illustrative embodiment of present disclosure wherein the deposition sequence 233 of FIG. 2a is adapted to form the first sub-layer 215a by forming two separate cap layer portions, as well as to perform additional intermediate treatment and processing steps so as to adjust the oxygen and nitrogen content distribution within the first sub-layer 215a. FIG. 2b schematically illustrates a close-up view of the semiconductor device 200 of FIG. 2a, in particular a close-up view of the lower portion of the gate electrode structure 210 in the area of the interface 210i, near the interfacial layer 208 and channel region 207. After the layer of high-k dielectric material 214 has been formed above the semiconductor device 200, a first metal gate cap layer 215a-1, which is the first of the two separate cap layer portions comprising the first sub-layer 215a, may be formed above the layer of high-k dielectric material 214. In some illustrative embodiments, such as when the transistor element 250 is a PMOS transistor element and the layer of high-k dielectric material 214 comprises HfO, the first metal gate cap layer 215a-1 may comprise, for example, TiN and the like. Depending on the specified device processing requirements, the first metal gate cap layer 215a-1 may be formed by performing a suitably designed conformal deposition process 233a, such as a physical vapor deposition (PVD) process and/or an ALD process. Furthermore, in certain embodiments the first metal gate cap layer 215a-1 may be formed to a thickness that is approximately one-half of the targeted thickness of the first sub-layer 215a. For example, when the targeted thickness of the first sub-layer 215a is approximately 15-20 Å, the first metal gate cap layer 215a-1 may be formed by the deposition process 233a to a thickness that ranges between approximately 5 Å and 10 Å.

FIG. 2c shows the illustrative semiconductor device 200 of FIG. 2b in a further manufacturing stage, wherein the transistor element 250 is exposed to an oxygen diffusion process 234. During the oxygen diffusion process 234, oxygen atoms diffuse into the first metal gate cap layer 215a-1 and along the grain boundaries toward the interface 210i, thereby increasing the overall oxygen content of the first metal gate cap layer 215a-1. In some illustrative embodiments, the oxygen diffusion process 234 may be performed under substantially ambient atmospheric conditions. For example, the oxygen diffusion process may be performed under typical clean room conditions, wherein the stoichiometry of the clean room atmosphere comprises an oxygen content ranging from 20-22% by weight, and wherein the temperature may be maintained between 18° C. and 22° C. In certain embodiments, the oxygen content may be approximately 21%, and the temperature may be approximately 20° C. Furthermore, in order to obtain the optimal amount of oxygen diffusion into the first metal gate cap layer 215a-1, the semiconductor device 200 may be exposed to the above-described clean room conditions for more than approximately 20 hours. In at least some embodiments, the semiconductor device 200 may be exposed to the above-described clean room conditions for approximately 24 hours.

In other illustrative embodiments, optimal diffusion of oxygen atoms into the first metal gate cap layer 215a-1 may also be obtained by performing the oxygen diffusion process 234 at a slightly elevated temperature and for significantly shorter period of time, thereby providing an additional degree of controllability to the diffusion process, and also reducing overall device processing time. For example, in some embodiments, the stoichiometry of the clean room atmosphere may be maintained substantially as described above—i.e., with an oxygen content of approximately 20-22%—however, the exposure temperature may be raised to approximately 200° C. or less, and the exposure time may decreased to approximately 60 minutes or less. In one illustrative embodiments, the oxygen diffusion process 234 may be performed in an atmosphere comprising approximately 21% by weight, at a temperature of approximately 150° C., and for a time of approximately 30 minutes.

After completion of the oxygen diffusion process 234, the second of the two separate cap layer portions comprising the sub-layer 215a may be formed above the first metal gate cap layer 215a-1—i.e., the first of the two separate cap layer portions comprising the sub-layer 215a. As shown in FIG. 2d, a second metal gate cap layer 215a-2 may be formed above the first metal gate cap layer 215a-1, which together, in this illustrative embodiment, may therefore comprise the first sub-layer 215a. In some embodiments, the second metal gate cap layer 215a-2 may be formed above the first metal gate cap layer 215a-1 by performing an appropriate conformal deposition process 233c, such as a PVD and/or ALD process. The thickness of the second metal gate cap layer 215a-2 may be as required such that the combined thicknesses of the first and second metal gate cap layers 215a-1, 215a-2 substantially meet the targeted thickness of the first sub-layer 215a, as previously described above. For example, when the targeted thickness of first sub-layer 215a is approximately 15-20 Å, and the thickness of the first metal gate cap layer 215a-1 ranges from 5-10 Å, then the thickness of the second metal gate cap layer 215a-2 may be approximately 4-8 Å. Additionally, depending on the device type and desired processing parameters, the second metal gate cap layer 215a-2 may comprise substantially the same material as the first metal gate cap layer 215a-1, such as, for example, TiN and the like. Furthermore, in some illustrative embodiments, the deposition parameters used to perform the deposition process 233c may be adjusted such that the nitrogen content of the second metal gate cap layer 215a-2 is greater than the nitrogen content of the first metal gate cap layer 215a-1, which may facilitate a further adjustment of the nitrogen content gradient throughout the first sub-layer 215a and the layer of high-k dielectric material 214, as will be further described below.

FIG. 2e shows the illustrative semiconductor device 200 of FIG. 2d in a yet further manufacturing stage, wherein the transistor element 250 is exposed to an thermal treatment 235. During the thermal treatment 235, at least some of the oxygen atoms present in the first sub-layer 215a—including at least some of the oxygen atoms previously diffused into the first metal gate cap layer 215a-1 during the oxygen diffusion process 234—may be driven toward the interface 210i and the layer of high-k dielectric material 214, thereby raising the oxygen content in the lower portion of the first sub-layer 215a (i.e., in the first metal gate cap layer 215a-1) and around the interface 210i. Furthermore, as oxygen atoms are driven toward the layer of high-k dielectric material 214, some of the nitrogen atoms that may be present in the first sub-layer 215a may also be "pushed" toward the interface 210i, thereby raising the nitrogen content in the first metal gate cap layer 215a-1 near the interface 210i. Moreover, as oxygen atoms in the first metal gate cap layer 215a-1 move toward the interface 210i, nitrogen atoms that may be present in the second metal gate cap layer 215a-2—which, as noted above, may have an increased nitrogen content—may also move toward the interface 210i so as to occupy abandoned oxygen sites. In this way, the oxygen gradient may generally increase around the interface 210i, and the nitrogen content may peak in the first sub-layer 215a, near the interface 210i.

In some illustrative embodiments, the thermal treatment 235 may be performed in a substantially oxygen-free atmosphere for a relatively short duration and at relatively low temperature, so as to thereby substantially avoid any growth and/or re-growth of the interfacial oxide layer 208 below the layer of high-k dielectric material layer 214, as well as the possible transformation of any TiN metal gate electrode material layers into TiO. For example, in certain embodiments, the thermal treatment 235 may be performed at a temperature less than approximately 400° C. for a time less than approximately 10 minutes. Furthermore, in at least one illustrative embodiment, the thermal treatment 235 may be performed at a temperature of approximately 300° C. for approximately 5 minutes. It should be noted, however, that other temperature and time combinations may be utilized for the thermal treatment 235, provided the deleterious effects associated with interfacial oxide growth and/or TiN transformation may be avoided, as previously described.

Figure 4A:
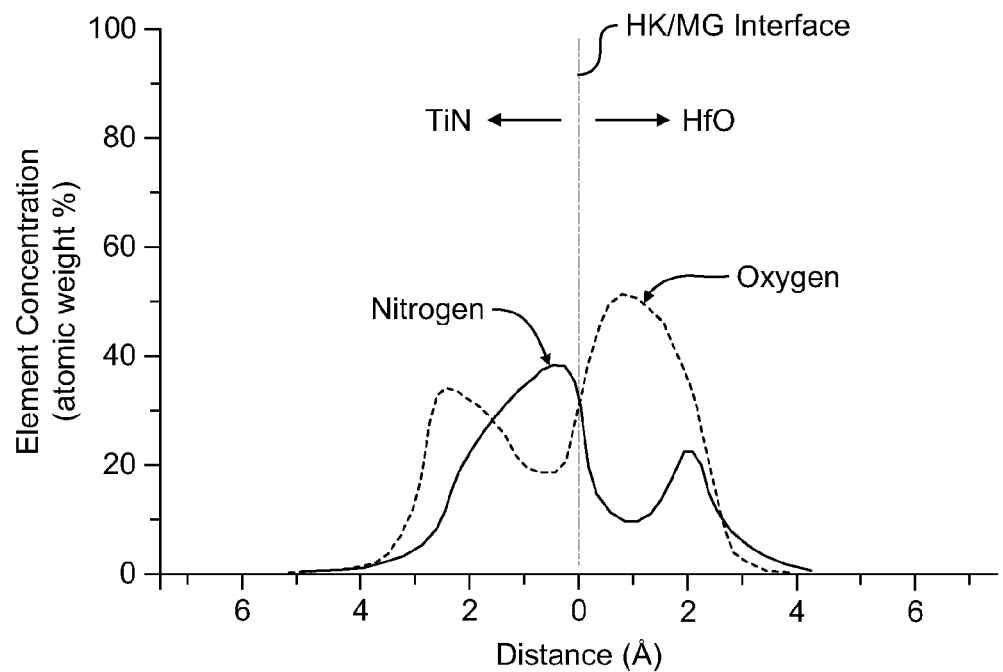
FIGS. 4a-4d each graphically represent illustrative oxygen and nitrogen contents in a replacement metal gate electrode near the interface of the replacement metal gate and a high-k dielectric layer, after the replacement metal gate electrode has been exposed to at least some of the illustrative manufacturing steps disclosed herein.
Figure 4B:
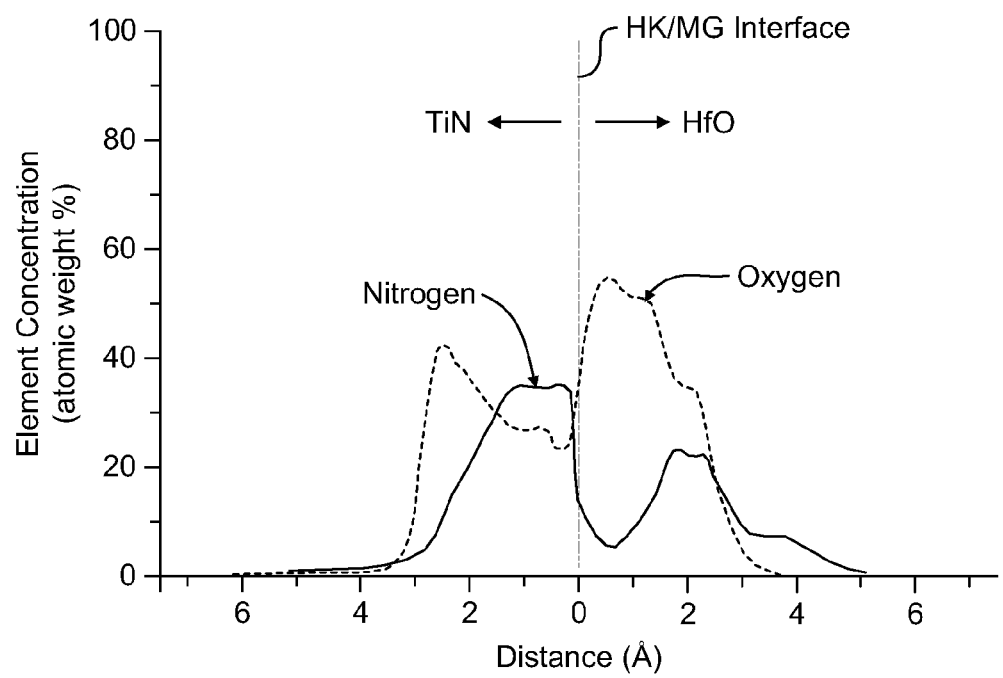

FIGS. 4a-4b each graphically represent illustrative oxygen and nitrogen content of a replacement metal gate electrode structure near the interface of the replacement metal gate and a high-k dielectric layer, after the replacement metal gate electrode has been exposed to at least some of the illustrative manufacturing steps described with respect to FIGS. 2b-2e above. More specifically, FIGS. 4a-4b both represent illustrative oxygen and nitrogen content in and around a hafnium oxide (HfO) gate dielectric layer and a titanium nitride (TiN) first metal gate electrode material layer of a PMOS transistor element manufactured using replacement metal gate techniques and at least some of the processing steps illustrated in FIGS. 2b-2e. The illustrative oxygen and nitrogen concentration curves shown in FIG. 4a represent experimental data from transistor elements 250 that have been exposed to a processing sequence wherein the oxygen diffusion process 234 of FIG. 2c has been performed under substantially ambient clean room conditions for approximately 24 hours. FIG. 4b, on the other hand, represents experimental data from transistor elements 250 that have been exposed to a processing sequence wherein the oxygen diffusion process 234 has been performed at approximately 150° for approximately 30 minutes. However, as can be seen in FIGS. 4a and 4b, the illustrative oxygen and nitrogen gradients for both sets of oxygen diffusion process parameters are substantially similar. For example, in both cases, the oxygen content substantially increases in both the TiN layer and the HfO layer within approximately 2-3 Å of the HK/MG interface, wherein the oxygen gradient ranges between approximately 20-50 atomic weight percent. Additionally, the nitrogen content in the TiN layer peaks very close to the HK/MG interface around 35-40 atomic weight percent. Accordingly, FIGS. 4a and 4b each represent illustrative oxygen and nitrogen concentration gradients which, in accordance with some theoretical models, may help to achieve low threshold voltage levels in some PMOS transistor elements.

FIG. 2f schematically illustrates an alternative embodiment of the semiconductor device 200 depicted in FIG. 2d, wherein the first and second metal gate cap layers 215a-1, 215a-2 comprise substantially the same material. In the alternative embodiment of FIG. 2f, the second metal gate cap layer 215a-2 may be comprised different material than the first metal gate cap layer 215a-1. For example, in some embodiments, the second metal gate cap layer 215a-2 may substantially comprise, for example, a titanium (Ti) material layer, which may be deposited above the first metal cap layer 215a-1 using a conformal deposition process 233c, such as a PVD process and the like. (See FIG. 2d.) Thereafter, a nitridization step 236 may be performed based on relatively low energy implantation parameters so as to perform a very shallow implant of nitrogen atoms into the upper surface of the second metal gate cap layer 215a-2. Accordingly, the nitrogen atoms implanted at the upper surface of the second metal cap layer 215a-2 may thereby act to block diffusion from the metal gate electrode work function material layers subsequently formed above the first sub-layer 215a.

In some illustrative embodiments, the nitridization step 236 may be performed by exposing a wafer comprising the semiconductor device 200 to a nitrogen plasma ambient in PVD chamber and applying bias to the wafer so as to accelerate nitrogen ions toward the surface of the wafer. Typical bias values may range, in certain embodiments, from 50-1000 watts, using a DC or RF plasma ranging from 50-5000 watts and processing times ranging between 5 and 180 seconds. In other illustrative embodiments, the nitridization step 236 may be performed by using a remote plasma source to create nitrogen atoms that are distributed by a showerhead across the wafer. In still other embodiments, the nitridization step 236 may be performed by heat up the wafer comprising the semiconductor device 200 in the presence of a nitrogen ambient, wherein the heating step may be accomplished in a suitable tool, such as a rapid thermal processing (RTP) anneal tool, or on a heated chuck in a PVD chamber, and the like. Depending on the actual process used to perform the nitridization step 236, the depth to which the nitrogen atoms are implanted may range on the order of 1-50 Å. Thereafter, device processing in accordance with FIG. 2e—i.e., the thermal treatment 235—may proceed substantially as described above.

FIGS. 2g-2l schematically depict an alternative embodiment of an illustrative "HK-last" replacement gate electrode technique, wherein the deposition sequence 233 of FIG. 2a has been further adapted to form the first metal gate cap layer 215a-1 of FIG. 2b in at least two sub-layer portions. As shown in FIG. 2g, a first sub-layer portion 215a-1a of the first metal gate cap layer 215a-1 may be formed above the layer of high-k dielectric material 214. In some illustrative embodiments, the first sub-layer portion 215a-1a may comprise, for example, TiN and the like, and may be formed by performing an appropriately designed conformal deposition process 233a, such as a PVD process and/or an ALD process. It should be noted that, as with the embodiments illustrated in FIGS. 2b-2f and described above, the targeted thickness of the first sub-layer 215a may also be approximately 15-20 Å, and the thickness of first metal gate cap layer 215a-1 may still be targeted to approximately one-half of the thickness of the first sub-layer 215a, or approximately 5-10 Å. As such, in certain embodiments, the total thickness of the two sub-layer portions comprising the first metal gate cap layer 215a-1 may also approximately equal the targeted thickness of the first metal gate cap layer 215a-1. For example, when the targeted thickness of the first metal gate cap layer 215a-1, the thickness of the first sub-layer portion 215a-1a may range on the order of approximately 2-5 Å.

FIG. 2h schematically illustrates the semiconductor device 200 of FIG. 2g in a further manufacturing step, wherein a second sub-layer portion 215a-1b of the first metal gate cap layer 215a-1 has been formed above the first sub-layer portion 215a-1a, together comprising, in this illustrative embodiment, the first metal gate cap layer 215a-1. In some embodiments, the second sub-layer portion 215a-1b may comprise a different material than that of the first sub-layer portion 215a-1a, such as, for example, titanium (Ti). Furthermore, the second sub-layer portion 215a-1b may be deposited above the first sub-layer portion 215a-1a using a suitable conformal deposition process 233b, such as a PVD process and the like. The thickness of the second sub-layer portion 215a-1b may be as required such that the combined thicknesses of the first and second sub-layer portions 215a-1a, 215a-1b substantially meet the targeted thickness of the first metal gate cap layer 215a-1, as previously described above. For example, when the targeted thickness of first metal gate cap layer 215a-1 is approximately 5-10 Å, and the thickness of the first sub-layer portion 215a-1a ranges from 2-5 Å, then the thickness of the second sub-layer portion 215a-1b may also be approximately 2-5 Å.

FIG. 2i shows the illustrative semiconductor device 200 of FIG. 2h in a further manufacturing stage, wherein the transistor element 250 is exposed to an oxygen diffusion process 234, which may be performed based on parameters that are substantially the same as described with respect to FIG. 2c above. In those embodiments of the presently disclosure wherein the first sub-layer portion 215a-1a substantially comprises TiN, oxygen atoms may diffuse into the first sub-layer portion 215a-1a and along the grain boundaries toward the interface 210i, thereby increasing the overall oxygen content of the first metal gate cap layer 215a-1. Additionally, however, in those embodiments wherein the second sub-layer portion 215a-1b substantially comprises Ti, it should be noted that substantially pure Ti material gathers significantly more oxygen than TiN material, and as such will tend to actually oxidize during the oxygen diffusion process 234. Moreover, under prolonged exposure and/or slightly elevated temperatures (as described with respect to FIG. 2c above), even more oxygen may diffuse along the grain boundaries, again substantially increasing the overall oxygen content of the first and second sub-layer portions 215a-1a, 215a-1b of the first metal gate cap layer 215a-1.

FIG. 2j schematically depicts the illustrative semiconductor device 200 of FIG. 2i in a further advance manufacturing stage, after completion of the oxygen diffusion process 234. As shown in FIG. 2j, the second metal gate cap layer 215a-2 may be formed above the first metal gate cap layer 215a-1, as previously described with respect to FIG. 2d above. In some embodiments, the second metal gate cap layer 215a-2 may be formed above the first metal gate cap layer 215a-1 (comprising the first and second sub-layer portions 215a-1a, 215a-1b) by performing an appropriate conformal deposition process 233c, such as a PVD and/or ALD process. The thickness of the second metal gate cap layer 215a-2 may be as required such that the combined thicknesses of the first and second metal gate cap layers 215a-1, 215a-2 substantially meet the targeted thickness of the first sub-layer 215a, as previously described above. In some illustrative embodiments, the second metal gate cap layer 215a-2 may comprise, for example, TiN and the like, whereas in other illustrative embodiments, the second metal gate cap layer may substantially comprise Ti. In those embodiments wherein the second metal gate cap layer 215a-2 comprises TiN, the deposition parameters used to perform the deposition process 233c may be adjusted such that the nitrogen content of the second metal gate cap layer 215a-2 is greater than the nitrogen content of the first metal gate cap layer 215a-1, which may facilitate a further adjustment of the nitrogen content gradient throughout the first sub-layer 215a and the layer of high-k dielectric material 214, as previously described above.

FIG. 2k shows the illustrative semiconductor device 200 of FIG. 2j during the exposure of the transistor element 250 the thermal treatment 235. As previously described with respect to FIG. 2e above, the oxygen and nitrogen content gradients in the first sub-layer 215a may be adjusted during the thermal treatment 235 such that the oxygen gradient may generally increase around the interface 210i, and the nitrogen content may peak in the first sub-layer 215a, near the interface 210i. Furthermore, the thermal treatment 235 may be performed based upon the temperature and time parameters previously outlined above.

Figure 4C:
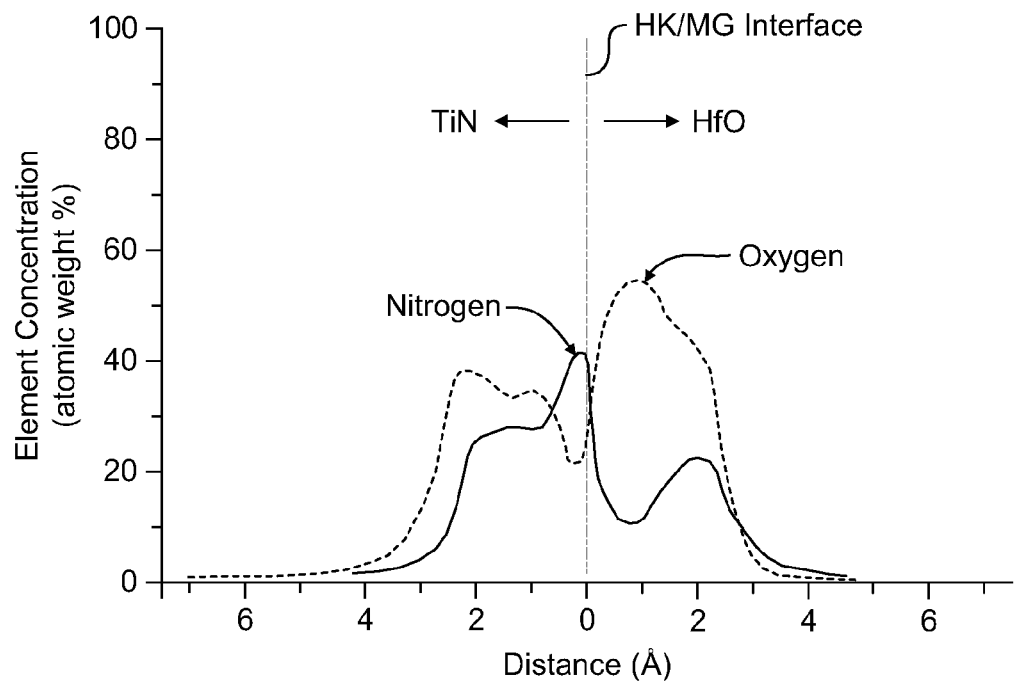
Figure 4D:
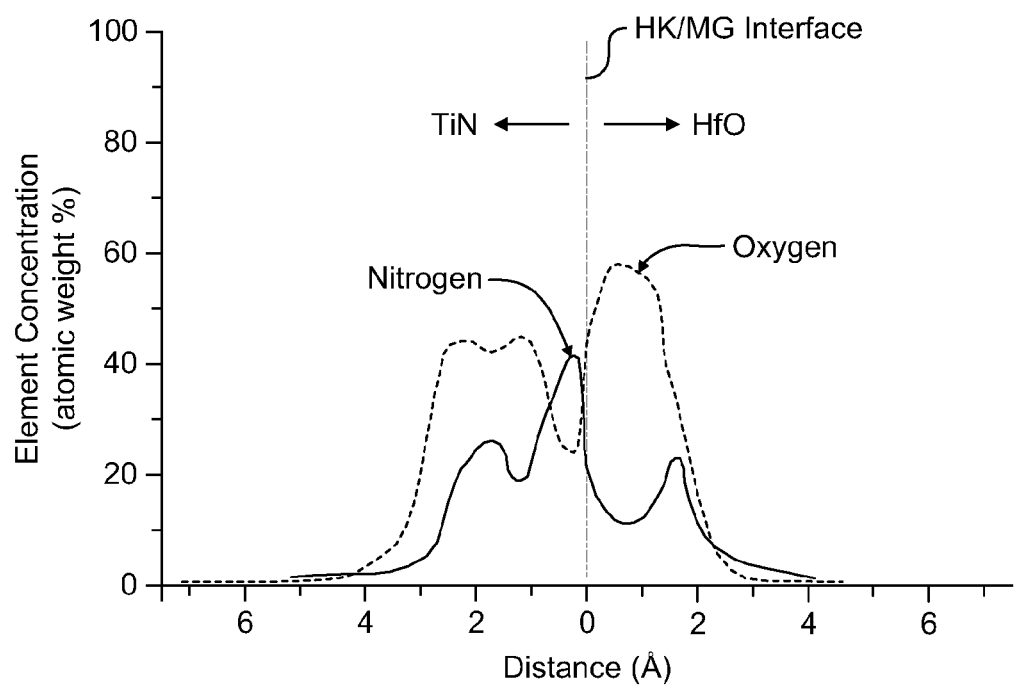

FIGS. 4c-4d each graphically represent illustrative oxygen and nitrogen content of a replacement metal gate electrode near the interface of the replacement metal gate and a high-k dielectric layer, after the replacement metal gate electrode has been exposed to at least some of the illustrative manufacturing steps described with respect to FIGS. 2g-2k above. Similar to FIGS. 4a-4b, FIGS. 4c-4c both represent illustrative oxygen and nitrogen content in and around a hafnium oxide (HfO) gate dielectric layer and a titanium nitride (TiN) first metal gate electrode material layer of a PMOS transistor element manufactured using replacement metal gate techniques and at least some of the processing steps illustrated in FIGS. 2g-2k. The illustrative oxygen and nitrogen concentration curves shown in FIG. 4c represent experimental data from transistor elements 250 that have been exposed to a processing sequence wherein the oxygen diffusion process 234 of FIG. 2i has been performed under substantially ambient clean room conditions for approximately 24 hours. FIG. 4d, on the other hand, represents experimental data from transistor elements 250 that have been exposed to a processing sequence wherein the oxygen diffusion process 234 has been performed at approximately 150° for approximately 30 minutes. FIGS. 4c and 4d, however, show that the illustrative oxygen and nitrogen gradients for both sets of oxygen diffusion process parameters are substantially similar. For example, in both cases, the oxygen content is substantially increased in both the TiN layer and the HfO layer within approximately 2-3 Å of the HK/MG interface, wherein the oxygen gradient ranges between approximately 25-60 atomic weight percent. Furthermore, the nitrogen content in the TiN layer peaks very close to the HK/MG interface around 40 atomic weight percent. As such, FIGS. 4c and 4d each represent illustrative oxygen and nitrogen concentration gradients which, in accordance with some theoretical models, may help to achieve low threshold voltage levels in some PMOS transistor elements.

FIG. 21 schematically depicts an illustrative embodiment of the semiconductor device 200 depicted in FIG. 2j, wherein the second metal gate cap layer 215a-2 may substantially comprise, for example, a titanium (Ti) material layer, which may be deposited above the first metal cap layer 215a-1 using a conformal deposition process 233c, such as a PVD process and the like. (See FIG. 2j.) Thereafter, a nitridization step 236 may be performed based on low energy implantation parameters as described above so as to perform a very shallow implant of nitrogen atoms into the upper surface of the second metal gate cap layer 215a-2. Accordingly, the nitrogen atoms implanted at the upper surface of the second metal cap layer 215a-2 may act to block diffusion from the metal gate electrode work function material layers subsequently formed above the first sub-layer 215a. Thereafter, device processing in accordance with FIG. 2k—i.e., the thermal treatment 235—may proceed as described above.

FIG. 2m schematically illustrates the semiconductor devices 200 of FIGS. 2e and 2k—i.e., after completion of the thermal treatment 235—in yet a further advanced manufacturing stage. As shown in FIG. 2m, all subsequent layers of metal gate electrode material have been formed above the semiconductor device 200 and inside of the opening 213, thereby forming the replacement metal gate electrode 210g. For example, the first layer of metal gate material 215 has been completely formed, wherein additional work function sub-layers, more specifically, second and third sub-layers 215b and 215c have been formed above the first sub-layer 215a. In some illustrative embodiments, such as wherein the transistor element 250 is a PMOS transistor element, the second and third sub-layers 215b, 215c may comprise, for example, TaN and TiN, respectively, however it should be noted that more or fewer sub-layers, comprising one or more of the metal gate materials listed above, may also be used to obtain the desired work function and operational characteristics of the transistor element 250. Additionally, a second layer of metal gate material 216, such as TiAl and the like, may be formed above the first layer of metal gate material 215 so as to completely fill the opening 213. Of course, it should be noted that, depending on the overall device design parameters, a single layer of metal gate electrode material could also be employed. Thereafter, further device processing may continue so as to remove excess material of the high-k dielectric material layer 214 and the first and second layers of metal gate material 215, 216 formed above the interlayer dielectric layer 212 and outside of the opening 213 so as to form the replacement metal gate electrode 210g.

It should be noted that, depending on the specific processing parameters of the desired integration scheme, the process sequences described above with respect to FIGS. 2a-2f and FIGS. 2g-2l may be performed in a single continuous process flow within a single processing tool, wherein the process conditions and/or precursor gases may be varied as required over the duration of the processing sequence. Furthermore, and depending on the desired layer configurations and sequence, the single processing tool may be, for example, a single-chamber processing capable of performing each of the processing steps outlined above. In other embodiments, the single processing tool may be a multi-chamber processing tool, which may include, for example, one or more processing chambers, such as deposition and/or annealing chambers, as well as load-lock chambers, buffer chambers, cool-down chambers, and the like.

FIGS. 3a-3d schematically illustrate replacement metal gate techniques of the subject matter disclosed herein that are based on an "HK-first" integration scheme, which will now be discussed in detail below.

Figure 3A:
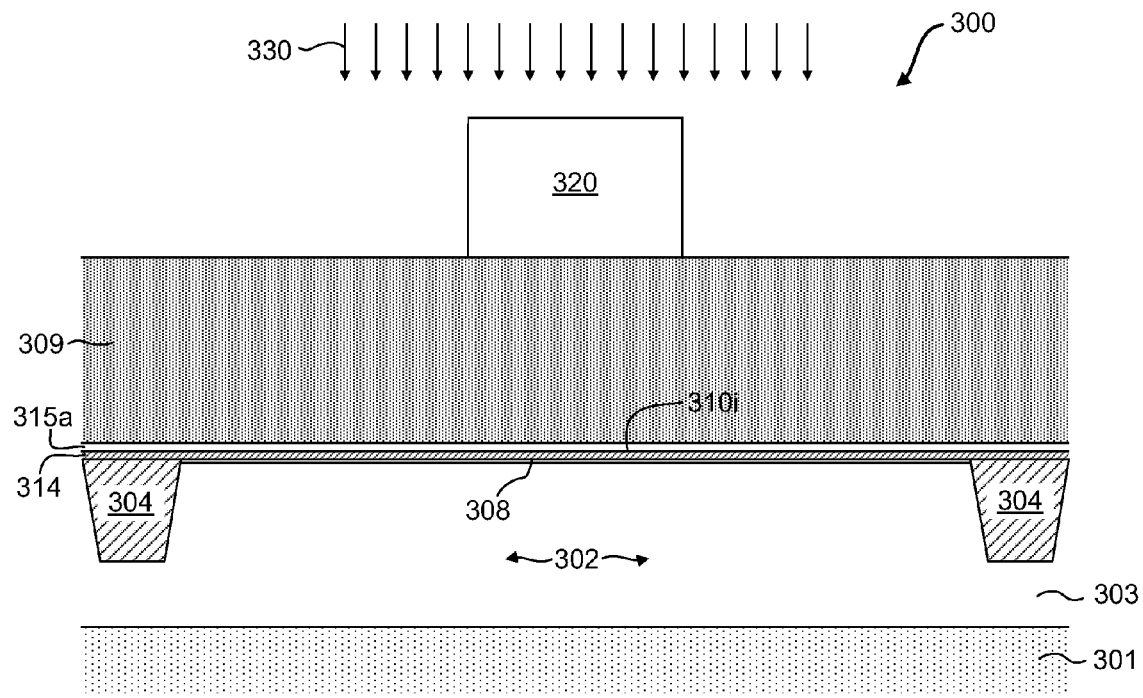
FIGS. 3a-3d schematically illustrate embodiments of an illustrative process flow of forming an "HK-first" replacement metal gate electrode in accordance with the subject matter disclosed herein.

FIG. 3a schematically depict an illustrative semiconductor device 300 of the present disclosure in an early stage of manufacturing. As shown in FIG. 3a, the semiconductor device 300 comprises a substrate 301, which may represent any appropriate substrate on which may be formed a semiconductor layer 303, such as a silicon-based layer, or any other appropriate semiconductor material that may facilitate the formation of MOS transistor elements, as previously described. In certain embodiments the semiconductor layer 303 may be formed on or be part of a substantially crystalline substrate material, while in other embodiments the semiconductor layer 303 may be formed on the basis of a silicon-on-insulator (SOI) architecture, in which a buried insulating layer (not shown) may be provided below the semiconductor layer 303. Additionally, the semiconductor device 300 of FIG. 3a may comprise an isolation structure 304, such as a shallow trench isolation structure, and the like, which may define an active region 302 comprising appropriate dopant species, depending on the type of MOS transistor element that may ultimately be formed in and above the active region 302. In at least some embodiments, an interfacial layer 308 may also be formed above the upper surface of the active region 302.

Also as shown in FIG. 3a, a layer of high-k dielectric material 314—i.e., a dielectric material having a dielectric constant, or k-value, of approximately 10 or greater—may be formed above the semiconductor device 300 so as to cover at least the interfacial layer 308. The processing methods used to form, and the materials comprising, the layer of high-k dielectric material 314 may substantially be as previously described for other illustrative embodiments disclosed herein. Additionally, a first sub-layer 315a of a metal gate electrode stack (see FIG. 3d) may be formed above the layer of high-k dielectric material 314. The first sub-layer 315a may comprise two or more material layers, and, during layer formation, may also be exposed at least one of the processing methods previously described with respect to FIGS. 2b-2e or FIGS. 2g-2k so as to adjust the oxygen and nitrogen content gradients in the first sub-layer 315a and the layer of high-k dielectric material 314, around the HK/MG interface 310i.

Next, a layer of dummy gate electrode material 309, such as polysilicon, and the like, may be formed above the first sub-layer 315a. Thereafter, a layer of mask material, such as photoresist, and the like, may be formed above the layer of dummy gate electrode material 309 and patterned, such as by appropriate lithography techniques and the like, to form an etch mask 320, as illustrated in FIG. 3a. The semiconductor device 300 may then be exposed to suitably designed etch process 330, such as an anisotropic reactive ion etch (RIE) process, and the like, so as to pattern the material stack shown in FIG. 3a to form a dummy gate electrode 310 (see FIG. 3b).

Figure 3B:
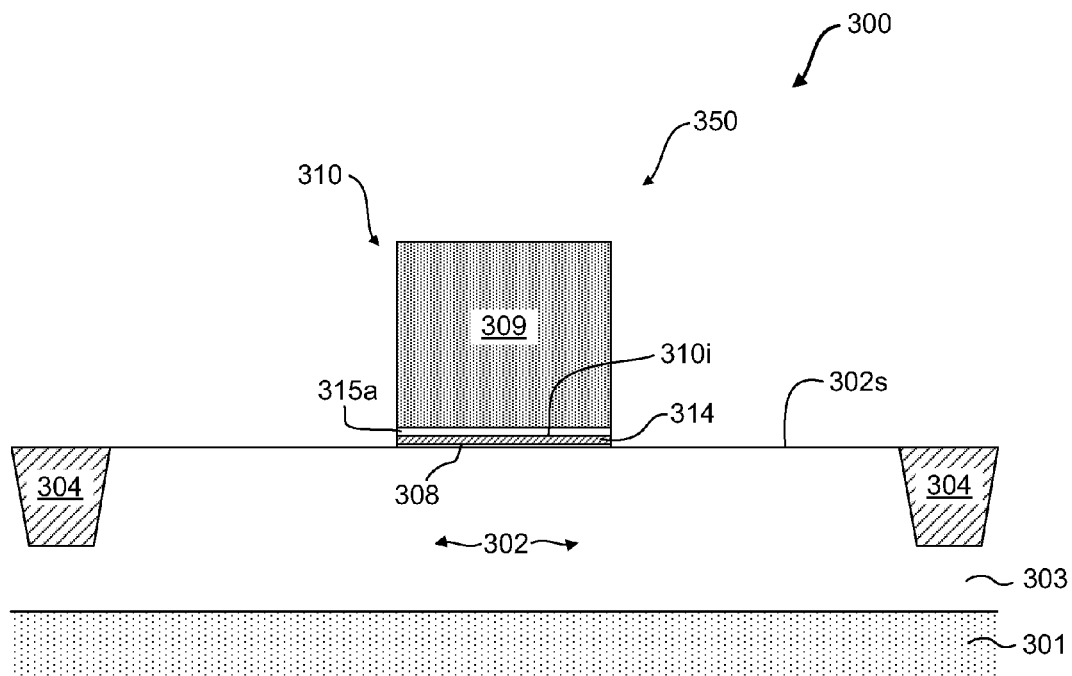

FIG. 3b schematically illustrates the semiconductor device 300 of FIG. 3a after completion of the etch process 330, wherein the dummy gate electrode structure 310 has been formed above the active region 302. As shown in FIG. 3b, the upper surface 302s of the active region 302 adjacent to and on either side of the dummy gate electrode structure 310 may be exposed during the etch process 330, thus preparing the semiconductor device 300 for further processing steps adapted to form an MOS transistor element 350, as discussed below.

Figure 3C:
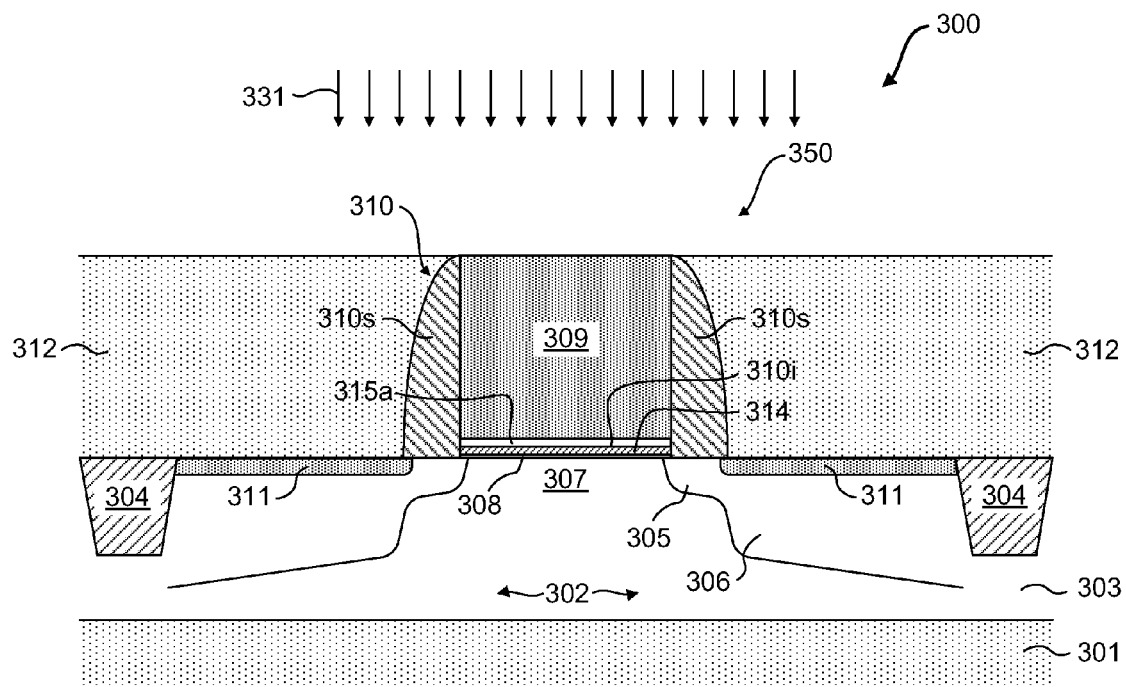

FIG. 3c schematically illustrates the semiconductor device 300 of FIG. 3b after the completion of several intermediate device processing steps, such as, for example, formation of the sidewall spacer structures 310s; formation of source/drain and extension regions 306, 305; formation of silicide regions 311, and the like. Thereafter, the semiconductor device 300 depicted in FIG. 3c may be exposed to a selective etch process 331 adapted to remove the dummy gate electrode 309 in preparation for forming the remaining layers of the replacement metal gate electrode 310g (see FIG. 3d). As previously discussed regarding other illustrative embodiments of the present subject matter disclosed herein, the etching process 331 may designed to selectively remove the material of the dummy gate electrode 309 relative to the material compositions of the sidewall spacer structures 310s, the interlayer dielectric material layer 311, and the first sub-layer 315a. For example, a dummy gate electrode 309 comprising polysilicon material may be selectively removed using a TMAH etch process, and the like, without inducing undue damage to the surrounding materials.

Figure 3D:
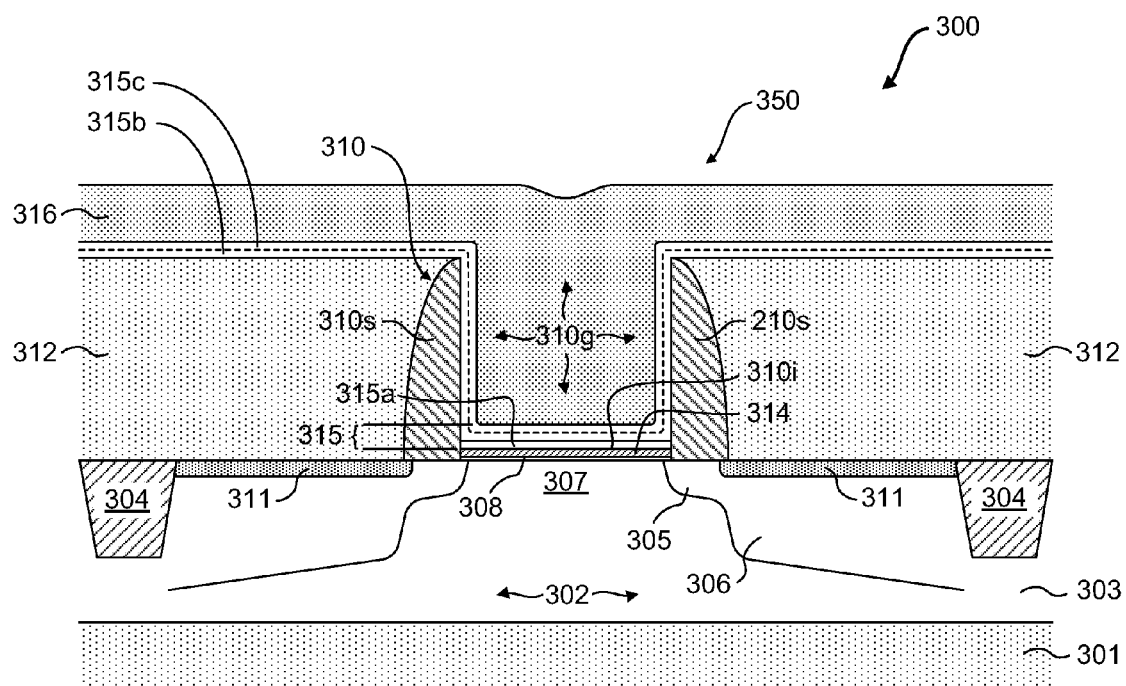

FIG. 3d schematically illustrates the semiconductor devices 300 of FIG. 3c in yet a further advanced manufacturing stage, after the formation of the replacement metal gate electrode stack has been completed, and the replacement metal gate electrode 310g has been formed. For example, in one illustrative embodiment, a first layer of metal gate material 315 has been completely formed, wherein additional work function sub-layers, more specifically, second and third sub-layers 315b and 315c have been formed above the first sub-layer 315a. Additionally, a second layer of metal gate material 316, may be formed above the first layer of metal gate material 315. Thereafter, further device processing may continue so as to remove excess material of the second and third sub-layers 315b, 315c and the second layer of metal gate material 316 formed above the interlayer dielectric layer 312 so as to form the replacement metal gate electrode 310g.

As a result, the subject matter disclosed herein provides manufacturing techniques for forming high-k dielectric/metal gate electrode (HK/MG) MOS transistor elements that may have a reduced threshold voltage ($V_t$) based on replacement gate integrations. Moreover, while some of the embodiments discussed above are directed to "HK-last" replacement metal gate integrations, other techniques disclosed herein may be applied "HK-first" integrations.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first metal gate electrode material layer above a gate dielectric material layer having a dielectric constant of approximately 10 or greater;
   exposing said first metal gate electrode material layer to an oxygen diffusion process;
   forming a second metal gate electrode material layer above said first metal gate electrode material layer; and
   adjusting an oxygen concentration gradient and a nitrogen concentration gradient in at least said first metal gate electrode material layer and said gate dielectric material layer.

2. The method of claim 1, wherein exposing said first metal gate electrode material layer to an oxygen diffusion process comprises exposing said first metal gate electrode material to an atmospheric ambient comprising approximately 20-22% oxygen.

3. The method of claim 2, wherein said first metal gate electrode material is exposed to said atmospheric ambient at a temperature of approximately 15-25° C. for a time of approximately 20 hours or greater.

4. The method of claim 3, wherein said first metal gate electrode material is exposed to said atmospheric ambient at a temperature of approximately 20° C. for a time of approximately 24 hours.

5. The method of claim 2, wherein said first metal gate electrode material is exposed to said atmospheric ambient at a temperature of approximately 150-200° C. for a time of approximately 60 minutes or less.

6. The method of claim 5, wherein said first metal gate electrode material is exposed to said atmospheric ambient at a temperature of approximately 150° C. for a time of approximately 30 minutes.

7. The method of claim 1, wherein adjusting said oxygen and nitrogen concentration gradients comprises adjusting said oxygen and nitrogen concentration gradients proximate an interface between said first metal gate electrode material and said gate dielectric material layer.

8. The method of claim 1, wherein adjusting said oxygen and nitrogen concentration gradients comprises exposing at least said first metal gate electrode material layer and said gate dielectric material layer to a thermal treatment.

9. The method of claim 8, wherein said thermal treatment is performed in a substantially oxygen-free ambient at a temperature less than approximately 400° C. and for a time of less than approximately 10 minutes.

10. The method of claim 9, wherein said thermal treatment is performed at a temperature of approximately 300° C. and for a time of approximately 5 minutes.

11. The method of claim 1, wherein said second metal gate electrode material layer is formed after exposing said first metal gate electrode material layer to said oxygen diffusion process and before adjusting said oxygen and nitrogen concentration gradients.

12. The method of claim 1, wherein forming said second metal gate electrode material layer comprises forming said second metal gate electrode material layer that has a material composition that is substantially the same as a material composition of said first metal gate electrode material layer.

13. The method of claim 12, wherein forming each of said first and second metal gate electrode material layers comprises forming a material layer substantially comprising titanium nitride.

14. The method of claim 1, wherein forming said second metal gate electrode material layer comprises forming said second metal gate electrode material layer having a material composition with a nitrogen content that is higher than a nitrogen content of said first metal gate electrode material layer.

15. The method of claim 1, wherein forming said second metal gate electrode material layer comprises forming said second metal gate electrode material layer that has a material composition that is substantially different than a material composition of said first metal gate electrode material layer.

16. The method of claim 15, wherein forming said first metal gate electrode material layer comprises forming a material layer substantially comprising titanium nitride, and wherein forming said second metal gate electrode material layer comprises forming a material layer substantially comprising titanium.

17. The method of claim 16, wherein forming said second metal gate electrode material layer comprises performing a nitridization process to implant nitrogen atoms into an upper surface of said second metal gate electrode material layer.

18. The method of claim 1, wherein forming said first metal gate electrode material layer comprises forming a first metal sub-layer and a second metal sub-layer, said second metal sub-layer having a different material composition than said first metal sub-layer.

19. The method of claim 18, wherein forming said first metal sub-layer comprises forming a material layer substantially comprising titanium nitride, and wherein forming said second metal sub-layer comprises forming a material layer substantially comprising titanium.

20. A method, comprising:
 forming a gate dielectric layer of a PMOS transistor element above an interfacial layer formed above an active region of a semiconductor device, said gate dielectric layer comprising a high-k dielectric material having a dielectric constant of approximately 10 or greater;
 forming a first layer of metal gate electrode material on said gate dielectric layer;
 exposing said first layer of metal gate electrode material to an oxygen diffusion process at a temperature less than approximately 200° C.;
 forming a second layer of metal gate electrode material on said first layer of metal gate electrode material; and
 exposing said semiconductor device to a thermal treatment in an oxygen-free ambient at a temperature less than approximately 400° C.

21. The method of claim 20, wherein forming said first layer of metal gate electrode material comprises forming a material layer comprising titanium nitride.

22. The method of claim 21, wherein forming said first layer of metal gate electrode material further comprises forming a further material layer comprising titanium.

23. The method of claim 20, wherein forming said second layer of metal gate electrode material comprises forming a material layer comprising titanium nitride.

24. The method of claim 20, wherein forming said second layer of metal gate electrode material comprises forming a material layer comprising titanium, and thereafter implanting nitrogen atoms into an upper surface of said second layer of metal gate electrode material.

25. The method of claim 20, wherein forming said gate dielectric layer comprises forming a material layer comprising hafnium oxide.

26. The method of claim 20, wherein said gate dielectric layer is formed above said interfacial layer prior to forming source and drain regions of said PMOS transistor element in said active region.

27. The method of claim 20, wherein said gate dielectric layer is formed above said interfacial layer after forming source and drain regions of said PMOS transistor element in said active region.

* * * * *